US010684975B1

(12) United States Patent
Wang et al.

(10) Patent No.: US 10,684,975 B1
(45) Date of Patent: Jun. 16, 2020

(54) ONE-HOT-BIT MULTIPLEXER CONTROL CIRCUITRY AND TECHNIQUE

(71) Applicant: Flex Logix Technologies, Inc., Mountain View, CA (US)

(72) Inventors: Cheng C. Wang, San Jose, CA (US); Fang-Li Yuan, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 108 days.

(21) Appl. No.: 15/798,224

(22) Filed: Oct. 30, 2017

Related U.S. Application Data

(60) Provisional application No. 62/419,884, filed on Nov. 9, 2016, provisional application No. 62/431,794, filed on Dec. 8, 2016.

(51) Int. Cl.
*G06F 13/40* (2006.01)
*G06F 13/20* (2006.01)

(52) U.S. Cl.
CPC .......... *G06F 13/4022* (2013.01); *G06F 13/20* (2013.01)

(58) Field of Classification Search
None
See application file for complete search history.

(56) References Cited

U.S. PATENT DOCUMENTS 6,658,617 B1 * 12/2003 Wong ............. G01R 31/318544
326/46
6,671,202 B1 * 12/2003 Bauer ...................... G11C 7/20
257/E27.081

* cited by examiner

Primary Examiner — Idriss N Alrobaye
Assistant Examiner — Dayton Lewis-Taylor
(74) Attorney, Agent, or Firm — Neil A. Steinberg

(57) ABSTRACT

An integrated circuit comprising a plurality of one-hot-bit multiplexers interconnected to form a switch interconnect network (e.g., hierarchical and/or mesh type networks), wherein each of the plurality of one-hot-bit multiplexers includes an output, inputs, and input selects, wherein each one-hot-bit multiplexer of the plurality of one-hot-bit multiplexers are capable of receiving: (i) an input select signal to select one of the plurality of inputs, (ii) an operational input signal at a selected input during a normal operation of the switch interconnect network, and (iii) an initialization input signal at the selected input during an initialization operation. The integrated circuit further includes initialization circuitry to generate a plurality of initialization input signals in response to an initialization signal, wherein the initialization input signals have (i) an identical data state and (ii) are applied to the selected input of each of the plurality of one-hot-bit multiplexers during the initialization operation.

20 Claims, 15 Drawing Sheets

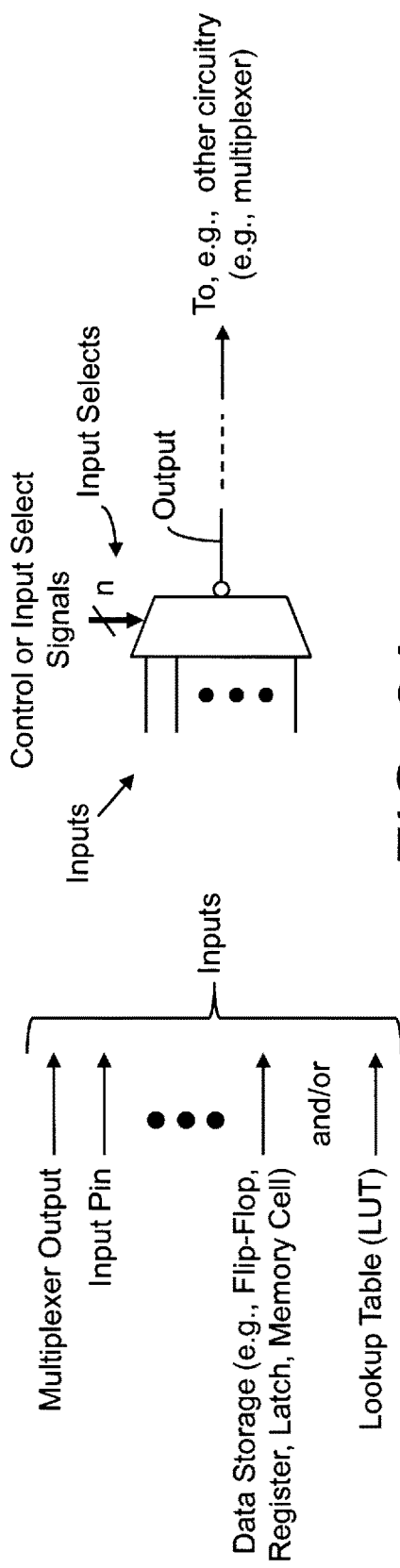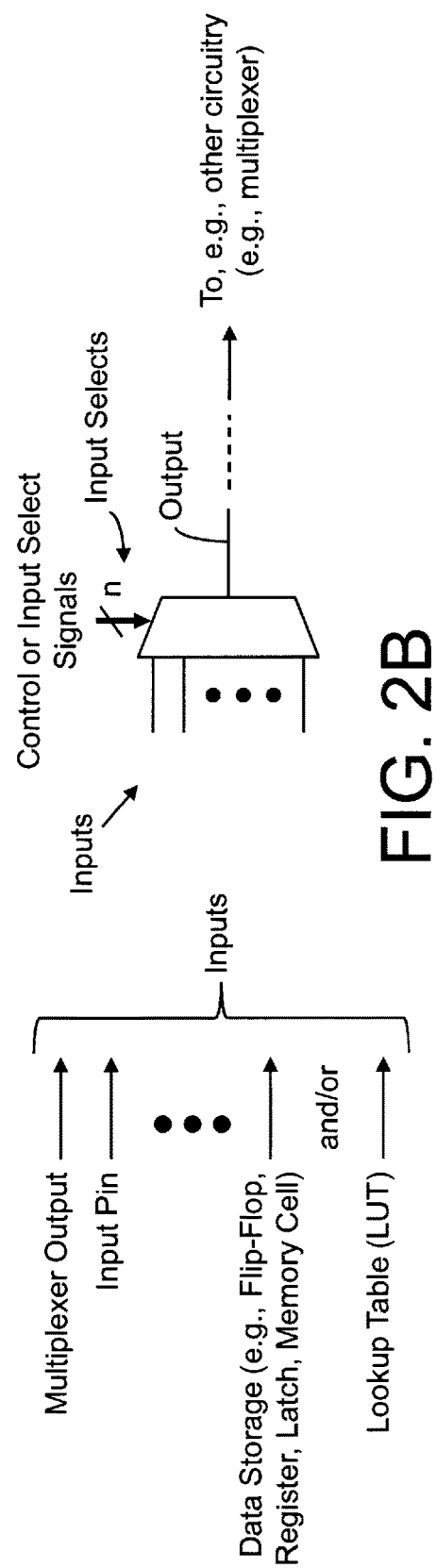

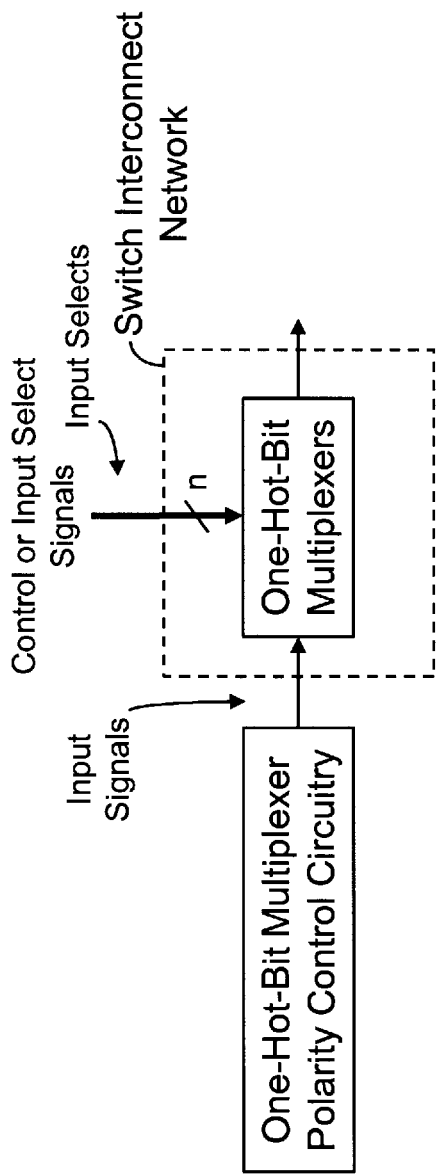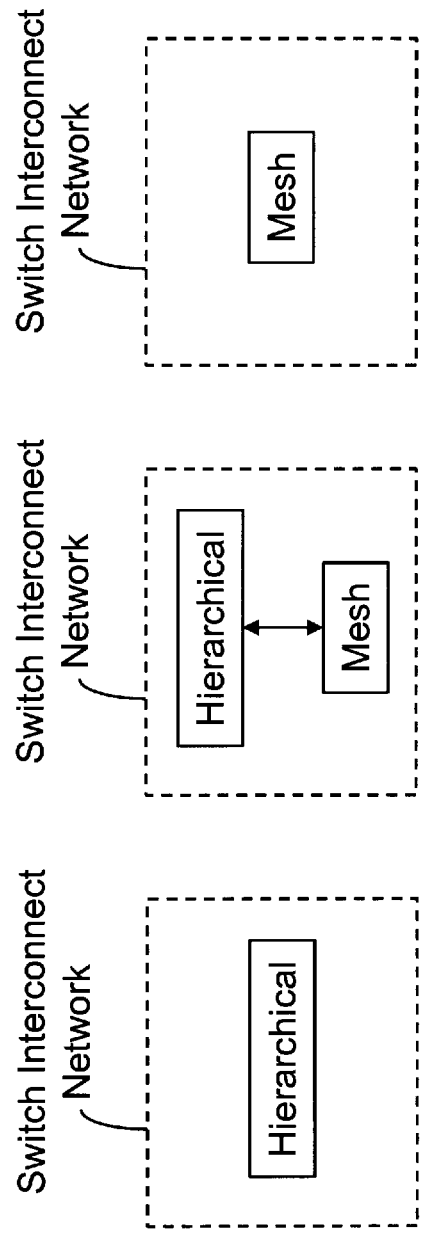
FIG. 4A

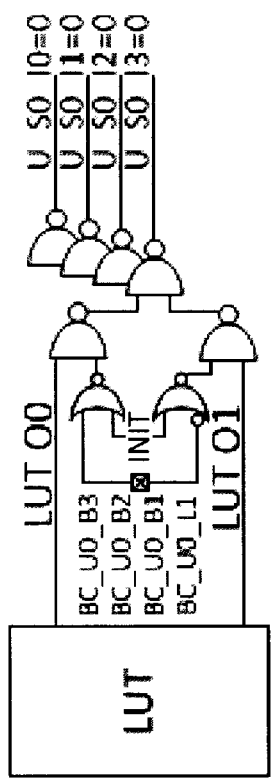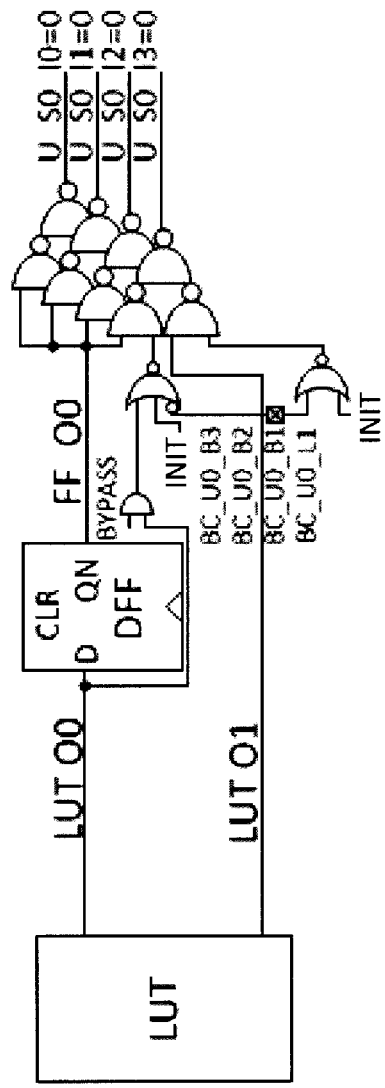
FIG. 5B

ONE-HOT-BIT MULTIPLEXER CONTROL CIRCUITRY AND TECHNIQUE

RELATED APPLICATION

This non-provisional application claims priority to U.S. Provisional Application No. 62/419,884, entitled "One-Hot-Bit Multiplexer Control Circuitry and Technique", filed Nov. 9, 2016, and U.S. Provisional Application No. 62/431,794, entitled "One-Hot-Bit Multiplexer Control Circuitry and Technique", filed Dec. 8, 2016 (hereinafter collectively "the Provisional Applications"). The Provisional Applications are incorporated herein by reference in their entirety.

INTRODUCTION

In one aspect, the present inventions are directed to circuitry to control one or more (or all) one-hot-bit multiplexers, for example, at or during power-up, start-up, initialization, re-initialization, configuration, re-configuration or the like, which are connected, organized and/or configured in a switch interconnect network of a processor, controller, state machine, gate array, programmable gate array (PGA), field programmable gate array (FPGA), and system-on-chip (SOC) (hereinafter collectively "integrated circuit"). In one embodiment, circuitry of the present inventions, at or during power-up, start-up, initialization, re-initialization or the like, programs the input signals of one or more (or all) one-hot-bit multiplexers of a switch interconnect network (for example, a hierarchical network and/or mesh network) to a common or the same polarity or data state such that each input of the one-hot-bit multiplexers of the switch interconnect network receives input signals having a common or the same polarity at or during such power-up, start-up, initialization, re-initialization or the like. The input signals may originate, for example, from data storage, a look-up table (LUT) or multiplexers (for example, a one-hot-bit multiplexer of the interconnect network). Where input signals to the one-hot-bit multiplexers are binary, circuitry according to the present inventions (a) generate the input signals either (i) a "high" or "1" data state or polarity, or (ii) a "low" or "0" data state and (b) apply such signals to the one-hot-bit multiplexers of a switch interconnect network to, at or during power-up, start-up, initialization, re-initialization or the like.

Upon completion of power-up, start-up, initialization, re-initialization, re-configuration or the like, the circuitry may be disengaged and the process terminated. In response, the input signals employed during normal operation of the interconnect network of the integrated circuit are applied to data and control inputs of the switch interconnect network, including the one-hot-bit multiplexers thereof, to establish desired or proper connectivity of the switch network. During normal operation of the interconnect network, the input data/signals and control or input select data/signals include characteristics that are typical when the integrated circuit is operational (and the input signals almost certainly do not have a common or the same polarity). That is, in normal operation the circuitry of the switch interconnect network (including the one-hot-bit multiplexers), the input signals applied to multiplexers of the network are unlikely the same polarity and not controlled by the power-up, start-up, initialization, re-initialization, configuration, re-configuration or the like process. Thus, control circuitry generates and applies input signals having a common or the same polarity or data state to the inputs of the one-hot-bit multiplexers of the switch interconnect network during or at power-up, start-up, initialization, re-initialization or the like sequence and, upon completion of the sequence, disengages (and/or terminates the process) to properly configure such multiplexers to establish, provide or facilitate normal or typical operation of the multiplexers of the switch interconnect network of the integrated circuit.

Notably, a one-hot-bit multiplexers may be characterized as a multiplexer receiving a plurality of input signals where, in or during normal or typical operation (i.e., when the integrated circuit is fully operational), one of the separately controllable inputs of the multiplexer is active or selected (i.e., multiplexer input(s) are/is electrically coupled to the multiplexer output) wherein the active or selected input(s) determine(s) the state/polarity of the output signal at the output of the multiplexer. For example, in one embodiment, a one-hot-bit multiplexer is a multiplexer where only one of the separately controllable inputs of the multiplexer is active or selected (i.e., electrically coupled to the output of the multiplexer) via certain control or input select signals and the other inputs of the multiplexer are inactive or not selected (i.e., not electrically coupled to the output of the multiplexer) via different control or input select signals; the data states of the signals which are applied to the input selects of the one-hot-bit multiplexer determine which input of the plurality of inputs of the multiplexer is active or selected.

In another aspect, present inventions are directed to methods of controlling such one-hot-bit multiplexers, for example, at or during power-up, start-up, initialization, re-initialization, configuration and re-configuration or the like (e.g., before normal operation).

As intimated above, in a typical configuration, when the switch interconnect network is operational, the inputs signals of a one-hot-bit multiplexer may be electrically connected to, for example, data storage elements, input pins, lookup tables and/or the output of another multiplexer (for example, one or more other one-hot-bit multiplexer of the switch fabric). The data states or polarities of such signals most likely differ and are likely not correlated. In one aspect of the present inventions, one-hot-bit multiplexer polarity control circuitry generates input signals, at or during power-up, start-up, initialization, re-initialization or the like, having a polarity or data state such that the polarity control circuitry applies input signals having the same polarity to one, some or all of the one-hot-bit multiplexers of the switch interconnect network. The polarity or data state of the input signals applied to each of the one-hot-bit multiplexers may be the same for each multiplexer (i.e., all inputs of all the one-hot-bit multiplexers may be the same polarity or data state) or different (i.e., the inputs of a first one-hot-bit multiplexer may have a first polarity or data state and the inputs of a second one-hot-bit multiplexer may have a second polarity or data state). The one-hot-bit multiplexer polarity control circuitry may be configured, for example, prior to or at manufacture, after manufacture and/or in situ.

In one embodiment, the one-hot-bit multiplexer polarity control circuitry and techniques of an integrated circuit may be selectively enabled or disabled, for example, prior to, at or during initialization, re-initialization or start-up, and/or in situ. For example, the system, user and/or operator may enable the one-hot-input multiplexer polarity control circuitry and/or process that generates, programs and/or applies the input signals of one or more (or all) one-hot-bit multiplexers of the switch interconnect network to a common polarity at or during power-up, start-up, initialization, re-initialization or the like (e.g., before normal operation). In one embodiment, a system, user and/or operator may program or store a data, value or command in a resident or an on-chip mode/operations register to enable or disable the one-hot-bit multiplexer polarity control circuitry and/or techniques. For example, in one embodiment, the data, value or command may control whether power is applied to the one-hot-input multiplexer polarity control circuitry. When power is applied to the control circuitry, the control circuitry engages and disengages as described herein; in contrast, when power is not applied to the one-hot-input multiplexer polarity control circuitry, the control circuitry and techniques described herein are not employed in relation to the one-hot-bit multiplexers of the switch interconnect network at or during power-up, start-up, initialization, re-initialization or the like.

Notably, any circuitry or technique now known or later developed (all of which are intended to fall within the scope of the present inventions) may be employed to enable or disable during, for example, initialization, re-initialization or at start-up, and/or in situ, the one-hot-bit multiplexer polarity control circuitry and techniques of an integrated circuit (for example, an FPGA).

In one embodiment, a system, circuitry (which may be located on-chip or off-chip), user and/or operator may analyze the switch fabric or interconnect network to identify one or more (or all) of the one-hot-bit multiplexers and thereafter manage or control the inputs of such multiplexers at or during power-up, start-up, initialization, re-initialization or the like as described and illustrated herein. Such system, circuitry, user and/or operator may identify which input signals of the one-hot-bit multiplexers differ in polarity depending on the in situ or "operating" polarity or state of an input signal (i.e., the polarity or state of an input signal during normal operation—which may originate in or be stored in, for example, a LUT). The one-hot-bit multiplexer polarity control circuitry may include or incorporate inverters (for example, at power-up) in one or more input signal paths where necessary to change the polarity of the input signals so that the one-hot-bit multiplexers of the switch interconnect network receive input signals having a common or the same polarity at or during such power-up, start-up, initialization, re-initialization or the like (e.g., before the integrated circuit is fully operational).

The system, circuitry, user and/or operator may also identify fixed signals that "conflict" (i.e., have or include a polarity of an input signal that is different from the polarity of one or more other input signals), and/or signals having an unknown polarity (for example, at power-up or start-up), and/or signals that are timing critical or in a critical path (wherein the timing of signals provided via the critical path are important for proper and orderly operation of the IC). Indeed, the one-hot-input multiplexer polarity control circuitry and/or processes may be configured, designed and/or implemented using such information or criteria/factors in order to determine a desirable or advantageous common polarity of the input signals to generate and apply to the one-hot-bit multiplexers of the switch interconnect network to, at or during power-up, start-up, initialization, re-initialization or the like. For example, where the input signals are fixed and not in the critical path (but have a polarity or data state that is different from other input signals of the multiplexer), the one-hot-bit polarity control circuitry may be configured to incorporate logic to change the polarity of such signals prior to applying such signals to a one-hot-bit multiplexer. Where, however, the signals are in the critical path, the one-hot-bit polarity control circuitry may be configured to avoid adverse impact on such signal (for example, by introducing one or more inverters or buffers into the critical path). Here, the one-hot-bit polarity control circuitry may be configured to modify the polarity of other input signals (for example, not timing critical or non-critical path signals) in order to establish or provide the appropriate polarity or data state of the input signals of the one-hot-bit multiplexers of the switch interconnect network. Thus, in one embodiment, the one-hot-bit polarity control circuitry may be configured to change the polarity of non-critical signals (i.e., signals whose timing is not critical). Notably, in another exemplary embodiment, where a critical path signals shares the same polarity with many non-critical paths of the same signal, a non-inverting buffer maybe used to drive the non-critical path signals to reduce the signal loading seen on the critical path.

With knowledge of the switch fabric/network and critical paths of signals in the switch fabric/network, the one-hot-bit polarity control circuitry may be configured, designed and/or implemented by incorporating one or more inverters into the path of the input signals so that the polarity of the signals applied to one-hot-bit multiplexers (whether such signals original from data storage or another multiplexer) are common at or during power-up, start-up, initialization, re-initialization or the like (for example, before normal operation of the integrated circuit). Notably, the signal paths of the input signals of the one-hot-bit multiplexer polarity control circuitry which determine the polarity of the input signals may be defined or programmed, for example, prior to manufacture, at manufacture, after manufacture, during initialization or start-up, and/or in situ. Indeed, the one-hot-bit multiplexer polarity control circuitry may include or employ any logic now known or later developed and any form of logic (for example, a multiplexer and/or AND, NAND, OR, NOR and/or inverter logic—which may have n-input and m-output gates, where n and m may be the same or different and are greater than or equal to one).

Thus, in one embodiment, the circuitry according to the present inventions may further determine and program a data state or polarity for the inputs of the one or more (or all) one-hot-bit multiplexers which accommodates predetermined considerations of the integrated circuit or operation thereof (for example, power consumption, amount of circuitry employed (e.g., number of inverters incorporated into the signal paths) and/or signals having critical timing).

In another aspect, the present inventions are directed to circuitry to control the data state of the configuration data of the multiplexers (for example, the one-hot-bit multiplexers) of the switch interconnect network, for example, at or during power-up, start-up, initialization, re-initialization, configuration, re-configuration or the like. In one embodiment, the "current" configuration data which is stored in memory cells which are connected to the control or input select inputs of the multiplexers of the switch interconnect network is "flushed" or "purged" (i) at or during power-up, start-up, initialization, re-initialization, configuration, re-configuration or the like, and (ii) before new configuration or re-configuration data (whether in an initial configuration or re-configuration sequence) is written, stored or programmed into such memory cells to provide or establish an interconnect configuration or new interconnect configuration of the of the multiplexers of the switch network. For example, in one embodiment, circuitry of the present inventions programs the control or input select data stored in the memory cells to a common or the same polarity or data state so that the state of each memory cell is known at or during such power-up, start-up, initialization, re-initialization, configuration, re-configuration or the like and before programming or storing control or input select data in the memory cells which correspond to the configuration or new configuration of the switches or multiplexers of the desired interconnect architecture of the switch network. Thereafter, the control or input select data is loaded, written, programmed or stored in the memory cells associated with, for example, one or more (or all) multiplexers of a switch interconnect network (for example, a hierarchical network and/or mesh network) which, in response, configures the switches or multiplexers to provide a desired switch interconnect network.

Thus, a flush or purge sequence or operation is performed before the new configuration data is written into the memory cells and is enabled or implemented before or during a configuration or re-configuration sequence of the switch interconnect network. The flush or purge sequence or operation stores a common or the same polarity or data state into each memory cell that store configuration data that control the switches or multiplexers of the switch interconnect network. In one embodiment, in operation, master-slave latches are placed in a transparent mode via simultaneous or concurrent application of the master and slave clock signals to the latches wherein known data (having a common polarity) are applied to or available at the input of the configuration memory cells. In another embodiment, the data signal AND'ed with the FLUSH or INIT signal, generating a constant logic low or 0, is applied to or available at the input of the configuration memory cells to store logic low or 0 data state into each memory cell. In another embodiment, the data signal OR'ed with the FLUSH or INIT signal, generating a constant logic high or 1, is applied to or available at the input of the configuration memory cells to store data having a logic high or 1 data state into each memory cell. Thereafter, a write command is applied to the memory cells to write/store the known data into the configuration memory cells. In one embodiment, before or after completion of the flush or purge sequence/operation, the memory cells may be programmed with data necessary to configure or re-configure the switches or multiplexers of the switch network to establish a desired interconnect architecture of the switch network at or during power-up, start-up, initialization, re-initialization, configuration and re-configuration or the like (e.g., before normal operation).

In another aspect, present inventions are directed to methods of controlling the configuration data stored in memory and thereafter applied to the multiplexers (for example, the one-hot-bit multiplexers) of the switch interconnect network, for example, at or during power-up, start-up, initialization, re-initialization, configuration, re-configuration or the like.

Briefly, an FPGA is an integrated circuit which is configured and/or reconfigured (hereinafter, unless stated otherwise, collectively "configured" or the like (for example, "configure" and "configurable")) by a user, operator, customer and/or designer before and/or after manufacture. In one embodiment, the FPGA includes, among other things, programmable logic components (often called "configurable logic blocks" (CLB), "logic array blocks" (LAB), or "logic tiles") and a network of configurable interconnects that facilitate communication between logic components.

In another embodiment, the FPGA includes, among other things, a plurality of tiles having programmable logic components (often called "configurable logic blocks" (CLB), "logic array blocks" (LAB), or "logic tiles"—hereinafter collectively "logic tiles") and a network of configurable interconnects that facilitate communication between the logic tiles. (See, for example, FIGS. 1A and 1B). Each logic tile typically includes thousands of transistors which may be configured to perform combinational and/or sequential functions (simple and/or complex). Such transistors are interconnected to form a plurality of multiplexers having two or more inputs. The selection inputs of the multiplexers may be electrically connected to data storage elements (for example, memory cells) which, when programmed, determine which input of the multiplexer is connected to the multiplexer output. The memory cells may be static or dynamic. For example, in the context of static cells, the selection inputs may be electrically connected to one or more input pins, flip-flops, latches and/or blocks/arrays of memory (for example, SRAM) that may be programmed after manufacture of the integrated circuit.

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as ideal, preferred or advantageous, for example, over other embodiments or implementations; rather, it is intended reflect or indicate the embodiment(s) is/are "example" embodiment(s).

FIGS. 2A and 2B illustrate an N-input inverting multiplexer and an N-input non-inverting multiplexer (where $N \geq 2$); in normal operation (for example, after power-up, start-up or performance of an initialization sequence), the data states or polarity of the signals applied to the control inputs may be dynamic or static and the signals applied to the multiplexer inputs may also be dynamic or static; such signals may originate from, for example, a data storage element (e.g., memory cell, register, flip-flop, latch, block/array of memory), an input pin, a LUT (of any kind or type), and/or an output of another multiplexer (for example, a multiplexer having a one-hot-bit design)); notably, the data storage element, input pin and/or LUT are typically set or programmed with a data state or polarity, for example, at power-up and/or during an initialization sequence;

FIGS. 4A and 4B illustrate exemplary block diagrams of one-hot-bit multiplexer polarity control circuitry operatively connected to one, some or all of the one-hot-bit multiplexers of the switch network of the IC in accordance with certain aspects of the present inventions, wherein, in the illustrated embodiment of FIG. 4B, the one-hot-bit multiplexer polarity control circuitry may be enabled or disabled by, for example, a system, user and/or operator prior to or during, for example, initialization or at start-up, and/or in situ operation;

Figure 3A:
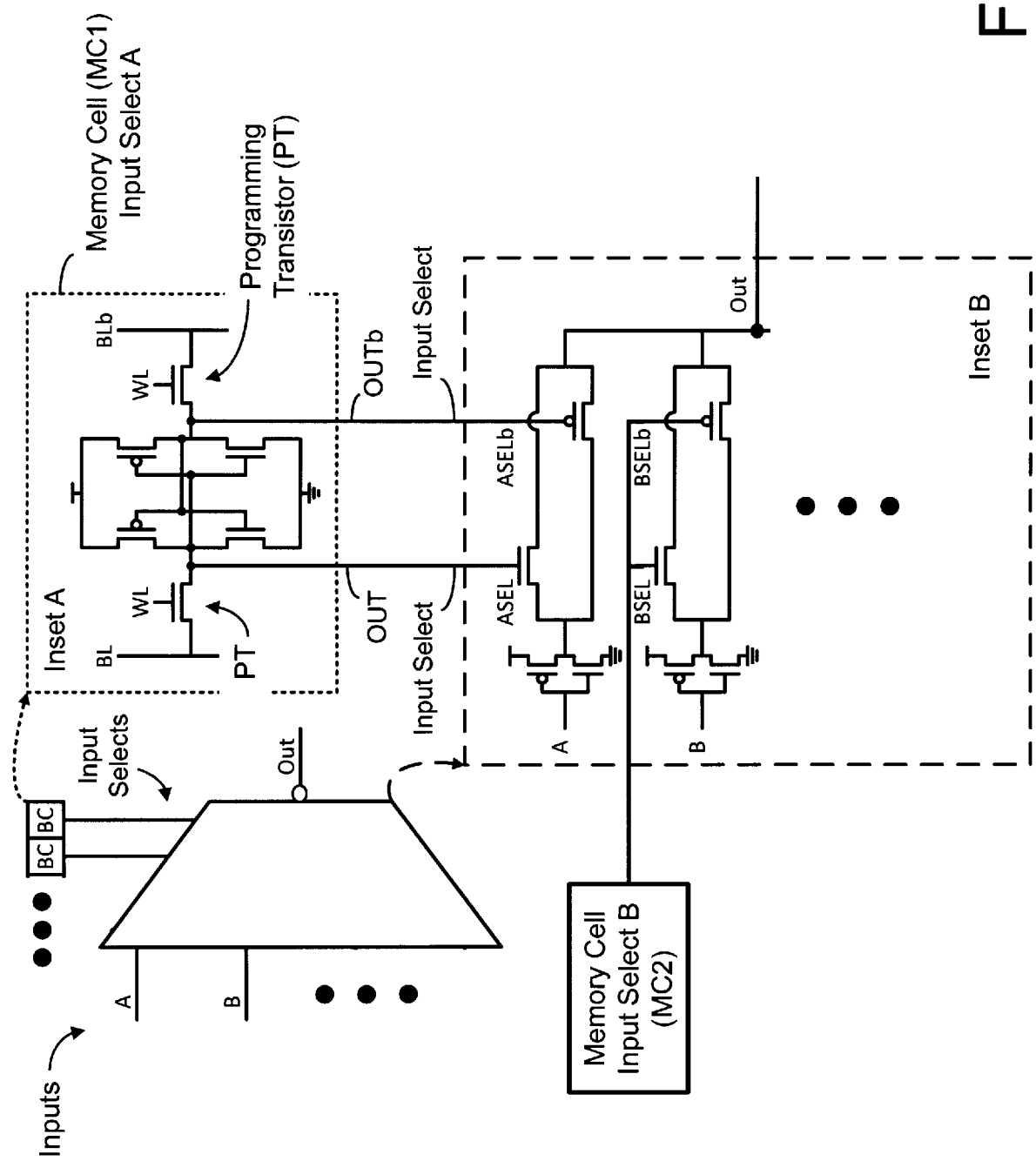
FIG. 3A illustrates an exemplary schematic block diagram representation an N-input inverting multiplexer (where N≥2; i.e., inputs (A, B . . . ) wherein, in this exemplary embodiment, each selection or control input is connected to an associated memory cell in accordance with certain aspects of the present inventions and wherein the data state of the memory cell determines which input(s) of the multiplexer is/are connected to the multiplexer output; notably, Inset A illustrates an exemplary static data storage element (e.g., a static memory cell (which, in this exemplary illustration, is a six-transistor SRAM cell—albeit the static memory cell may be a latch, flip/flop (e.g., a JK-type flip/flop) or any other memory cell or memory cell circuit now known or later developed), and Inset B illustrates an exemplary multiplexer circuit at a transistor and logic level; moreover, in this exemplary embodiment, the multiplexer consists of a plurality of transmission gates and, as such, both the true-and-complement outputs (OUT and OUTb) of each memory cell are routed to respective gate of the NMOS and PMOS transistors of the transmission gates of each input to output propagation path (which, in this exemplary embodiment, routes 2*N input-selection conductors from the memory cells to the associated circuitry in the multiplexer) which drives or is applied to the output.
Figure 3B:
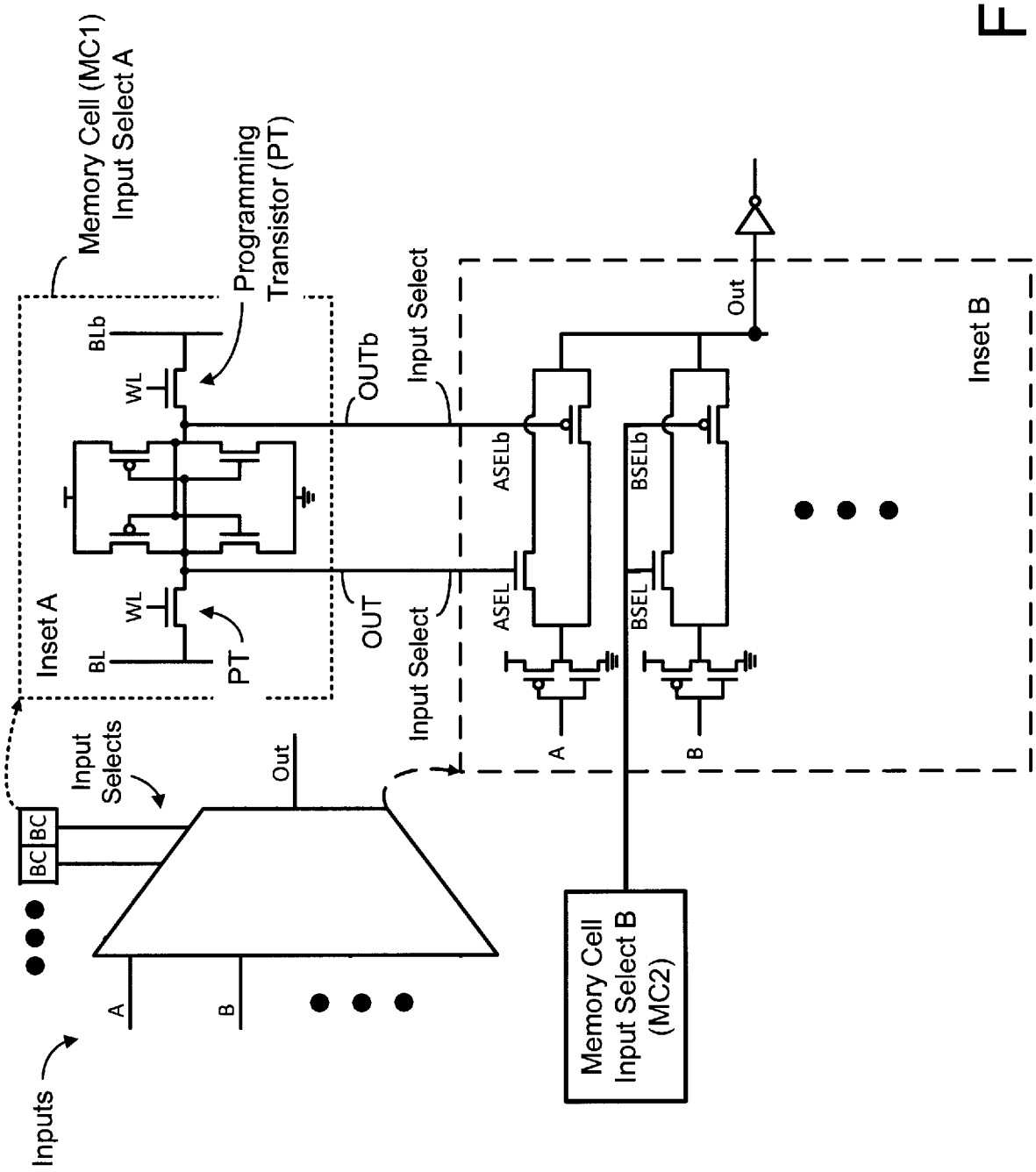
FIG. 3B illustrates an exemplary schematic block diagram representation an N-input non-inverting multiplexer (where N≥2; i.e., inputs (A, B . . . ) in accordance with certain aspects of the present inventions wherein each selection or control input is connected to an associated data storage element (e.g., memory cell) whose data state determines which input of the non-inverting multiplexer is connected to the multiplexer output; notably, Inset A again illustrates an exemplary static memory cell and Inset B again illustrates an exemplary multiplexer circuit at a transistor and logic level; moreover, the multiplexers of FIGS. 3A and 3B may operate as a one-hot-bit design and, as such, under typical programming only one input-selection is enabled at any given time (otherwise multiple inputs are shorted together); here, however, the multiplexers of FIGS. 3A and 3B may be programmed so that a plurality of input-selections are enabled wherein a plurality of inputs are electrically connected to the multiplexer output; notably, in the exemplary embodiment of FIG. 3B, the input (A, B, or . . . ) is initially applied to an inverter and thereafter applied to the transmission gates, wherein the selected input then drives or is applied to an inverter circuit (compare FIG. 3A)
Figure 5A:
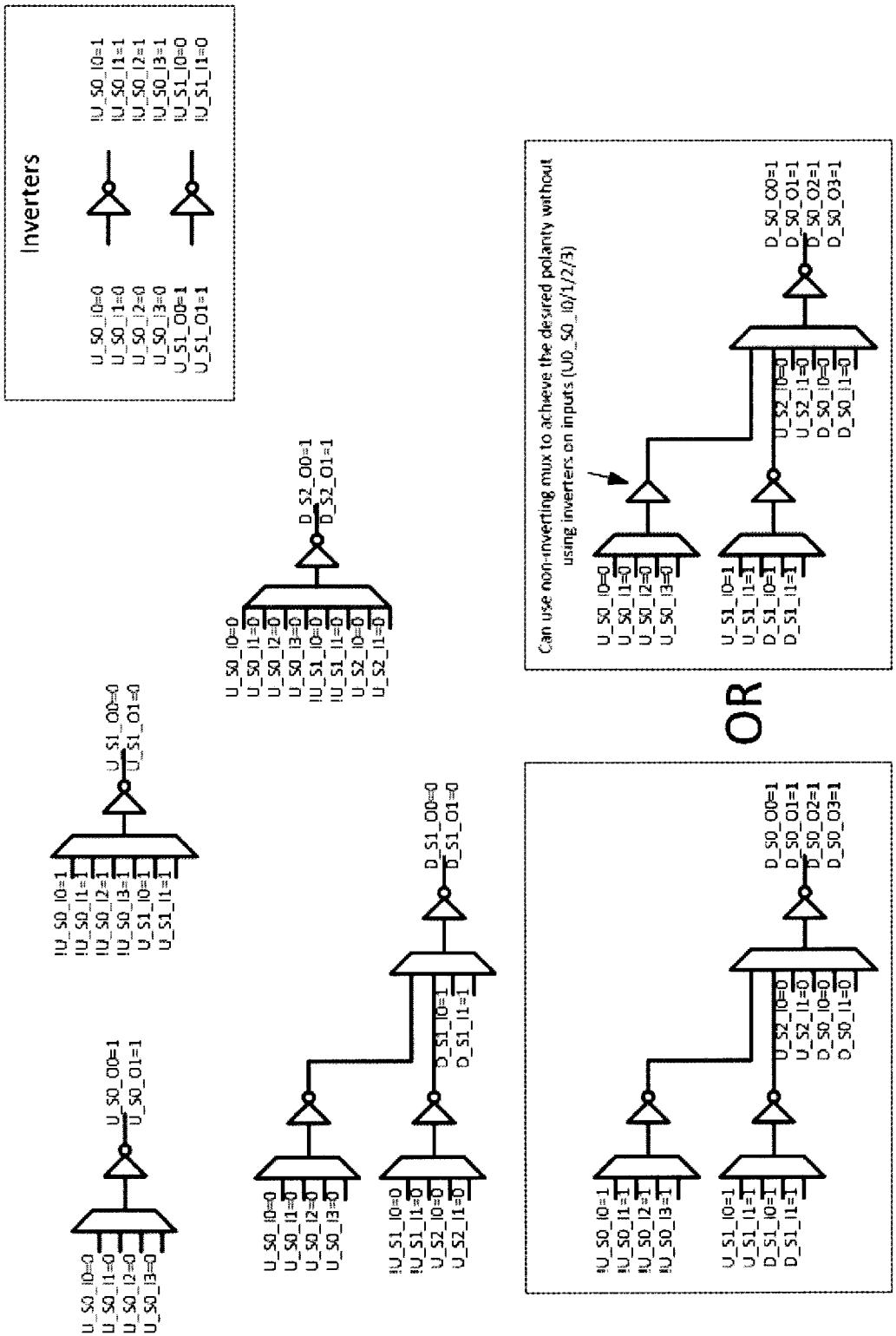
Figure 6A:
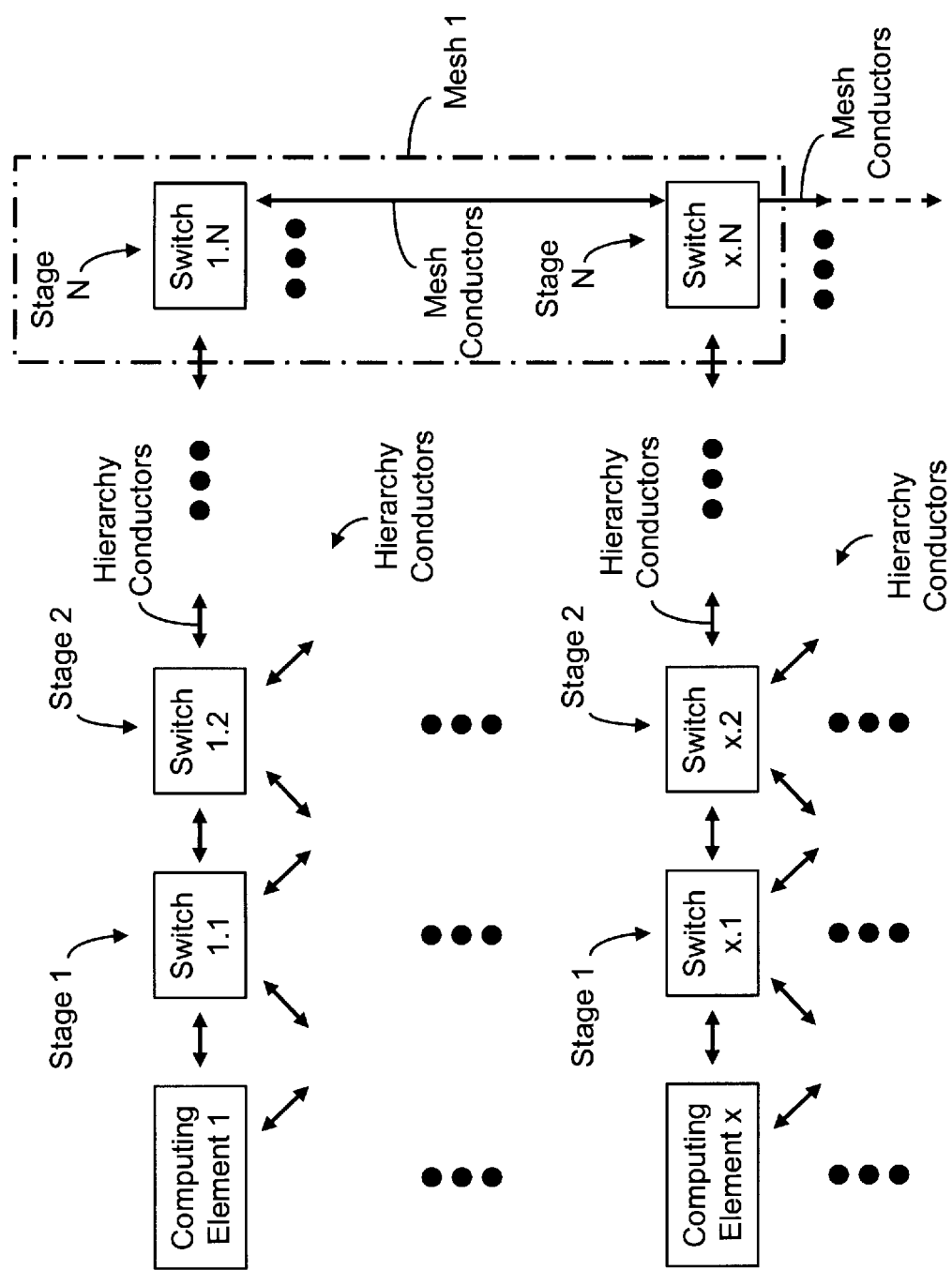
Figure 6B:
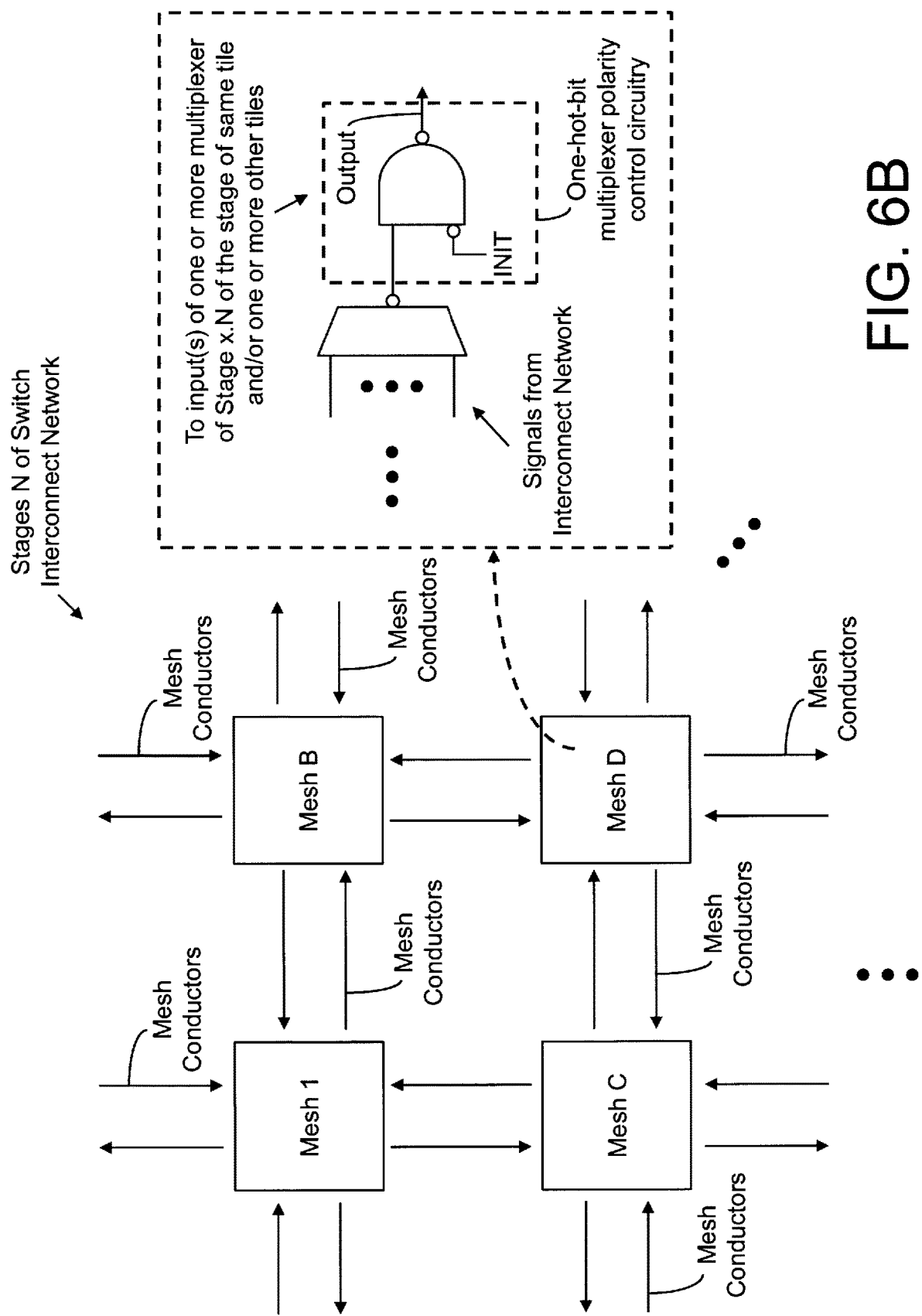
Figure 6C:
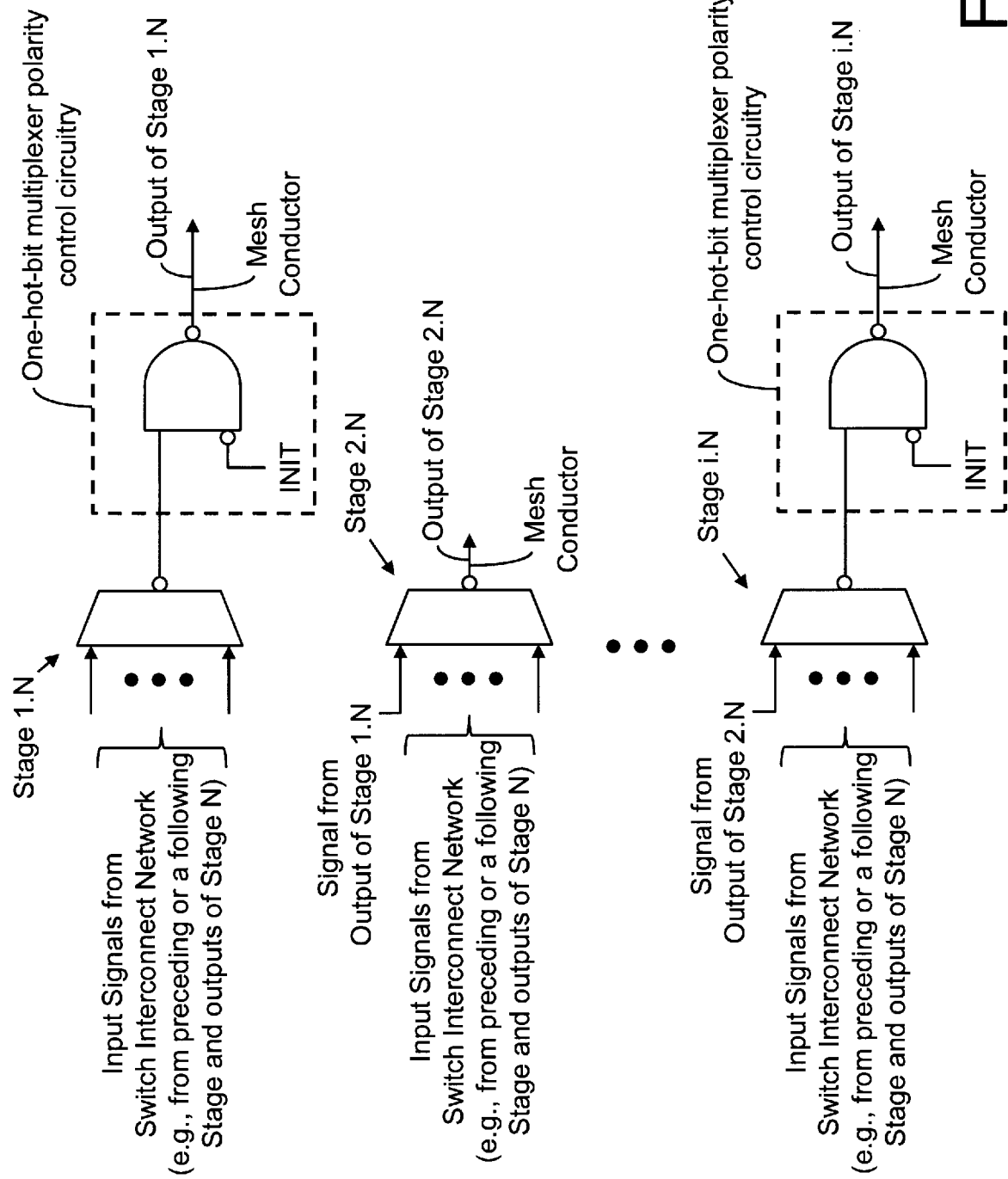
Figure 7A:
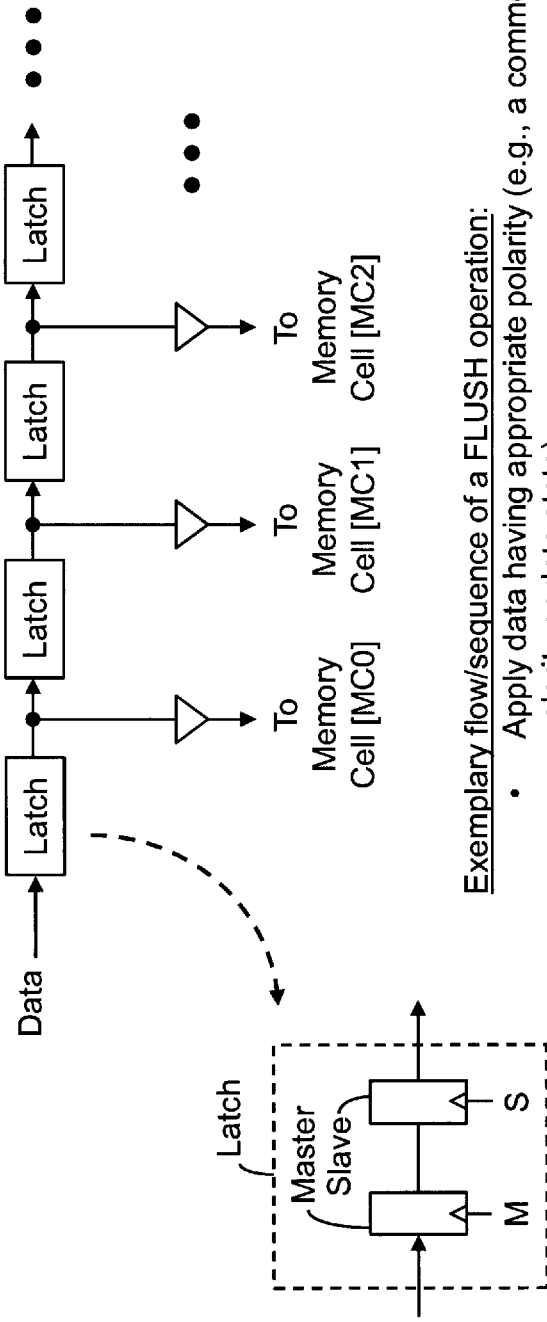
Figure 7B:
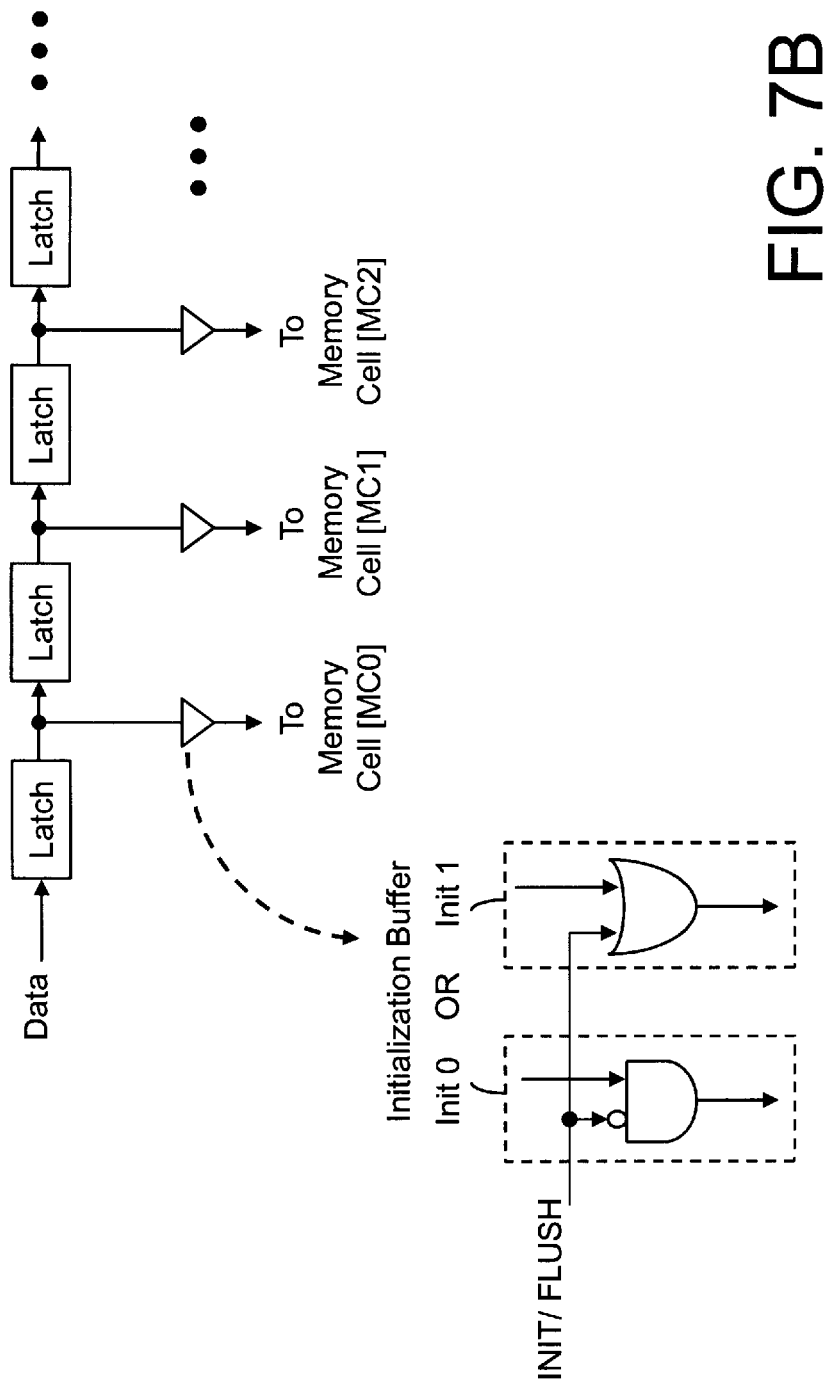
Figure 8:
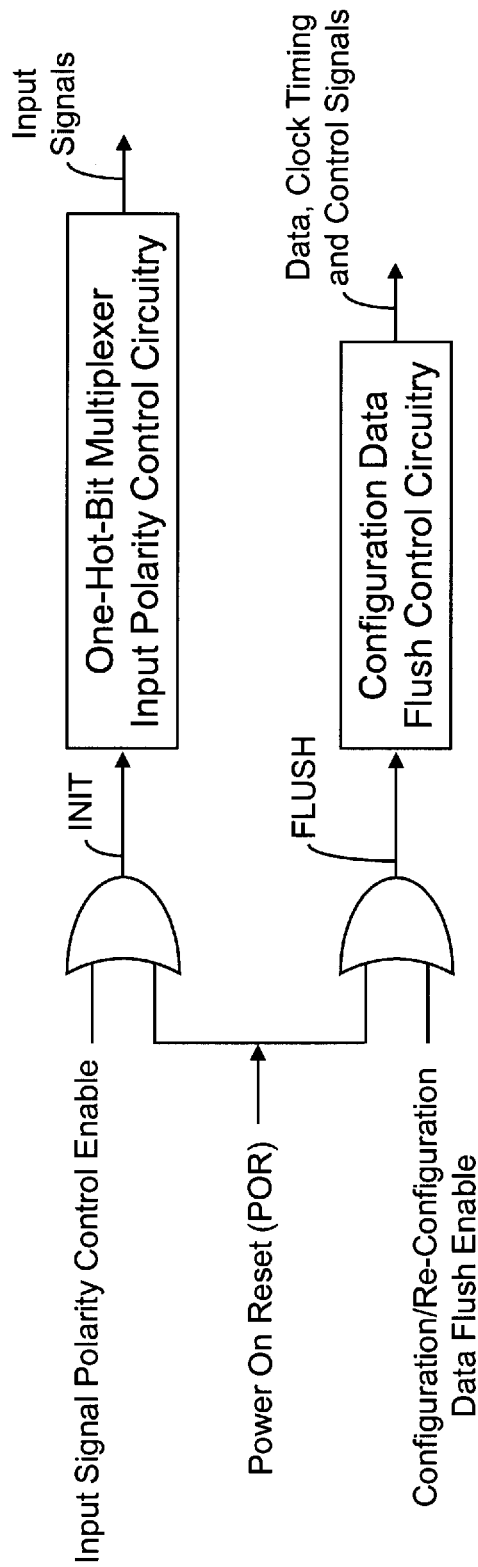

the system, user and/or operator may control whether the one-hot-bit multiplexer polarity control circuitry is employed via, for example, defining a state of a dedicated input, storing a value or command in an on-chip register or latch (e.g., mode/operations register), and/or a fixed input signal (e.g., from a pin such as a physical pin or conductor) or a programmable/re-programmable input signal (e.g., generated dynamically upon power-up) applied to the one-hot-bit multiplexer polarity control circuitry; for example, when the one-hot-bit multiplexer polarity control circuitry is disabled, such circuitry does not control of the polarity or data state of the input signals applied to the one or more one-hot-bit multiplexers of the switch interconnect network at or during power-up, start-up, initialization, re-initialization or the like; notably, the switch interconnect network may be any form or type of architecture or configuration now known or later developed including, for example, a hierarchical architecture, a hierarchical-mesh architecture, and a mesh architecture (see, for example, FIG. 4A);

FIGS. 5A and 5B illustrates an exemplary schematic diagram, in accordance with certain aspects of the present inventions, of exemplary embodiment of one-hot-bit multiplexer polarity control circuitry (which receives inputs from multiplexers of the switch interconnect network) to program the inputs of one or more one-hot-bit multiplexers of the switch interconnect network to a common polarity at or during power-up, start-up, initialization, re-initialization or the like (e.g., before normal operation of the integrated circuit), wherein the signals are routed to and/or through the circuitry (for example, multiplexers and/or AND, NAND, OR, NOR, inverter and/or buffer gates/logic which may have n-input and m-output gates, where "n" and "m" are (i) each whole numbers that are greater than or equal to one and (ii) may be the same or different values) to generate a signal, having a predetermined polarity, to apply to inputs of one or more one-hot-bit multiplexers of the switch interconnect network; notably, depending on the polarity or state of an input signal to the multiplexer while the switch interconnect network is operational (i.e., the polarity or state of an input signal during normal operation—which may originate in or be stored in, for example, a LUT—see FIG. 5B and its logic gates associated with INIT=1), the one-hot-bit multiplexer polarity control circuitry may incorporate inverters (see dotted box labeled "Inverters" in FIG. 5A) in one or more signal paths where necessary to change the polarity so that the one-hot-bit multiplexers of the switch interconnect network receive input signals having a common or the same polarity at or during such power-up, start-up, initialization, re-initialization or the like while the polarity control circuitry is enabled;

FIG. 6A illustrates a simplified exemplary schematic block diagram representation of an exemplary interconnect architecture, according to at least one aspect of the present inventions, including a plurality of computing elements (for example, a look-up-table, processor circuit, controller circuit and/or combinational logic circuit) and an interconnect network of switch matrices including one or more stages configured in a hierarchical network and one or more other stages configured in a mesh network; for example, in this illustrative embodiment, switch matrices of Stages 1 and 2 are configured in a hierarchical architecture and switch matrices of Stage N are configured in a mesh architecture wherein, as a mesh architecture (and unlike a hierarchical architecture), the outputs of the switches or multiplexers of Stage N are selectively routed to a plurality of other switches/multiplexers of Stage N—that is, the output routing remains within Stage x.N (wherein the signal travels between a plurality of switches 1.N and x.N, and thereafter the signal may travel within the other Stages connected to the mesh network—e.g., to the computing element (CE) by entering the hierarchical network via Stage N−1, through the other stages to the CE); indeed, one or more mesh networks may be incorporated at any stage (or all stages) of the exemplary interconnect architecture; notably, each bidirectional wire may be a single conductor or multiple sets of unidirectional wires/conductors and much of the detailed interconnections between switch matrices of the stages have been eliminated for purposes clarity; and FIG. 6B illustrates an exemplary schematic block diagram representation of a mesh-type network (which, in one embodiment, is a stage of the interconnect network of FIG. 6A (for example, Stage N)) according to certain aspects of the present inventions, wherein one-hot-bit multiplexer polarity control circuitry connected within the mesh network (here, within each Stage of the mesh network) of the interconnect network, when enabled or engaged programs the inputs of one or more one-hot-bit multiplexers of the mesh interconnect network to a common polarity at or during power-up, start-up, initialization, re-initialization or the like (e.g., before normal operation of the integrated circuit); notably signals are routed to and/or through the circuitry (for example, multiplexers, AND, NAND, OR, NOR, inverter and buffer which may have n-input and m-output gates, where "n" and "m" are (i) each whole numbers that are greater than or equal to one and (ii) may be the same or different values) to generate a signal, having a predetermined polarity, to apply to inputs of one or more one-hot-bit multiplexers of the mesh network stage of switch interconnect network; in operation, depending on the polarity or state of a control signal INIT of the NAND gate, the switch interconnect network is either in a normal operational state or a power-up, start-up, initialization or the like state; when in power-up, start-up, initialization, or the like state, INIT=1 (high) and the logic circuitry of the one-hot-bit multiplexer polarity control circuitry (in this illustrative exemplary embodiment, a plurality of NAND gates) generates signals, applied to one or more signal paths, having a common or the same polarity so that the one-hot-bit multiplexers of the mesh stage(s) of the interconnect network receive input signals having a common or the same polarity; however, when in normal operation, the control circuitry is disabled or disengaged via changing the data state of the control signal INIT (i.e., in this exemplary embodiment, INIT=0 (low)) and the NAND gates, from the perspective of the control circuitry, are disabled or disengaged and the output signals of such NAND gates are determined by the output signal of the multiplexer which corresponds to normal operation; notably, the signals from the interconnect network which are applied to the multiplexer(s) coupled to the NAND gates may be, in one embodiment, signals from other stages of the interconnect network associated with the mesh network stage and/or signals that are output from the other NAND gates of Stage x.N of the mesh networks connected thereto;

FIG. 6C illustrates a more detailed exemplary schematic block diagram representation of a mesh-type network (which, in one embodiment, is a stage of the interconnect network of FIGS. 6A and 6B (for example, Stage N of the switch interconnect network)) according to certain aspects of the present inventions, wherein one-hot-bit multiplexer polarity control circuitry (in this exemplary embodiment, a NAND gate) is connected to the output of one or more or all of the switches of the Stage N of the mesh network and, when enabled or engaged, programs the inputs of one or more (or all) of the one-hot-bit multiplexers of (mesh) Stage N of the network to a common polarity at or during power-up, start-up, initialization, re-initialization, configuration, re-configuration or the like (e.g., before normal operation of the integrated circuit); notably, in the mesh architecture, each switch matrix or switch of Stage N is connected to (i) an input of a plurality of other switch matrices or switches of Stage N and (ii) at least one output or input of a switch matrix(ces) of preceding or following stage, respectively; when enabled, the one-hot-bit multiplexer polarity control circuitry generates a signal, having a predetermined polarity, to apply to at least one input of one or more of one-hot-bit multiplexers of one or more of the switch matrices of mesh stage N of switch interconnect network, which, in turn, generate(s) and apply(ies) inputs having a common or the same polarity to the other one-hot-bit multiplexers of the switch matrices of mesh stage N of an associated logic tile or a plurality of logic tiles (see FIG. 6B); as mentioned above, in operation, depending on the polarity or state of a control signal INIT of the NAND gate, the switch interconnect network is either in a normal operational state or a power-up, start-up, initialization or the like state—the operation of which is described above in connection with FIG. 6B; although illustrated as a NAND logic gate, the one-hot-bit multiplexer polarity control circuitry may be any logic now known or later developed, for example, AND, NAND, OR, NOR, inverter and/or buffer gates/logic;

FIG. 7A illustrates outline of an exemplary flow or sequence of a FLUSH operation according to certain aspects of the present inventions together with an exemplary schematic block diagram representation of input data circuitry for connecting to memory cells, for example, that store data associated with the input selects of multiplexers of the switch interconnect network (see, for example, FIGS. 3A and 3B which illustrate an exemplary embodiment, in schematic form, such memory cells (i.e., memory cells that store control or input select data) being connected to the pass gates of associated input-output paths in the multiplexers); notably, in a preferred embodiment, the latches are a master-slave type; in one embodiment, when the flush sequence/operation is enabled/implemented before or during a configuration or re-configuration sequence of the switch interconnect network, the data stored in a plurality (or all) of the memory cells employed to configure the switch interconnect network is overwritten by data that propagates through the plurality of latches to the associated memory cells that store the data used to configure the network; in operation, the latches are placed in a transparent mode via simultaneous or concurrent application of the master and slave clock signals to the latches wherein known data is applied to or available at the input of the configuration memory cells; thereafter, the write command is applied to the memory cells to write/store the known data into the memory cells; in one embodiment of the FLUSH sequence, the data written into the memory cells is the same (e.g., in a binary implementation, (i) a "high" or "1" data state or polarity or (ii) a "low" or "0" data state); in one embodiment, before or after completion of the flush or purge sequence/operation, the memory cells may be programmed with data necessary to configure or re-configure the switches or multiplexers of the switch network to establish a desired interconnect architecture of the switch network;

FIG. 7B illustrates outline of an exemplary flow or sequence of a FLUSH operation according to certain aspects of the present inventions together with an exemplary schematic block diagram representation of input data circuitry for connecting to memory cells, for example, that store data associated with the control signals of multiplexers of the switch interconnect network (see, for example, FIGS. 3A and 3B which illustrate an exemplary embodiment, in schematic form, such memory cells (i.e., memory cells that store input select control signals) being connected to the pass gates of associated input-output paths in the multiplexers); notably, in a preferred embodiment, the FLUSH or INIT signaled may be (i) OR'ed with the data signal to generate a "high" or "1" data state or polarity or (ii) AND'ed with the data signal to generate a "low" or "0" data state); in one embodiment, before or after completion of the flush or purge sequence/operation, the memory cells may be programmed with data necessary to configure or re-configure the switches or multiplexers of the switch network to establish a desired interconnect architecture of the switch network;

FIG. 8 illustrates an exemplary schematic block diagram representation to selectively apply, upon application of one control signal (power on reset (POR)) and either or both (sequentially or concurrently) of the configuration/re-configuration data flush control and the one-hot-bit multiplexer input signal polarity control; the input data polarity control operation and the input select data flush operation may be performed sequentially or concurrently; notably, although illustrated as a OR logic, the one-hot-bit multiplexer polarity control circuitry may be any logic now known or later developed, for example, AND, NAND, OR, NOR, inverter and/or buffer gates/logic.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In a first aspect, the present inventions relate to circuitry to control one or more (or all) one-hot-bit multiplexers, which are connected, arranged and/or configured in a switch interconnect network of an integrated circuit, at or during power-up, start-up, initialization, re-initialization, configuration, re-configuration or the like (e.g., when the switch interconnect network of an integrated circuit is not yet operational). In one embodiment, circuitry of the present inventions, at or during power-up, start-up, initialization, re-initialization, configuration, re-configuration or the like, programs the input signals of one or more (or all) one-hot-bit multiplexers of a switch interconnect network to a common or the same polarity or data state. In this way, the inputs of a given one-hot-bit multiplexer of the switch interconnect network (for example, a hierarchical network and/or mesh network—see, for example, U.S. patent application Ser. No. 15/041,085, which is incorporated herein by reference) receive input signals having a common or the same polarity at or during such power-up, start-up, initialization, re-initialization, configuration, re-configuration or the like. Where input signals to the one-hot-bit multiplexers are binary, circuitry according to the present inventions (a) generate input signals either (i) a "high" or "1" data state or polarity, or (ii) a "low" or "0" data state and (b) apply such signals to the one-hot-bit multiplexers of a switch interconnect network to, at or during power-up, start-up, initialization, re-initialization, configuration, re-configuration or the like— regardless of the characteristics of the input signals received or to be received in or during normal or typical operation of one-hot-bit multiplexers of the interconnect network.

For example, in one embodiment of the present inventions, input signals applied to the inputs of one or more (or all) one-hot-bit multiplexers of the switch interconnect network of the integrated circuit are programmed or configured, via one-hot-bit multiplexer polarity control circuitry, to a common or the same polarity to data state so that each input of the one-hot-bit multiplexer receives an input signal having the same or a common polarity or data state at or during, for example, power-up, start-up, initialization, re-initialization or the like, as the other inputs of the one-hot-bit multiplexer at or during power-up, start-up, initialization, re-initialization, configuration, re-configuration or the like. Thereafter (for example, after completion of an initialization sequence), the one-hot-bit multiplexer polarity control circuitry may be disengaged (and thereby disabled) and the inputs of the one-hot-bit multiplexers receive the normal or operational input signals (which have the normal or typical operational characteristics—including a polarity or data state of the normal operation of the switch interconnect network). That is, upon completion of power-up, start-up, initialization, re-initialization or the like, the one-hot-bit multiplexer polarity control circuitry may be disengaged and the process terminated. In response, the input signals generated during normal or typical operation of the interconnect network (which may originate, for example, from data storage, a look-up table (LUT) or another one-hot-bit multiplexers of the interconnect network) are applied to inputs of the one-hot-bit multiplexer wherein the input signals include the appropriate/designed characteristics that are typical when the switch interconnect network of the integrated circuit is operational.

As stated above, a one-hot-bit multiplexers may be characterized as a multiplexer receiving a plurality of input signals where, in or during normal or typical operation (i.e., when the integrated circuit is fully operational), one of the inputs of the multiplexer is active or selected (i.e., multiplexer input(s) are/is electrically coupled to the multiplexer output) wherein the active or selected input(s) determine(s) the state/polarity of the output signal at the output of the multiplexer. For example, in one embodiment, a one-hot-bit multiplexer is a multiplexer where only one of the inputs of the multiplexer is active or selected (i.e., electrically coupled to the output of the multiplexer) via input select signals and the other inputs of the multiplexer are inactive or not selected (i.e., not electrically coupled to the output of the multiplexer) via input select signals which are different from the input select signals associated with the active or selected inputs; the data states of the signals which are applied to the control inputs associated with each of the inputs of the one-hot-bit multiplexer determine which input of the plurality of inputs of the multiplexer is active or selected.

Notably, the one-hot-bit multiplexer may be any multiplexer configuration or type. For example, the one-hot-bit multiplexer may be an inverting type or a non-inverting type. (See, for example, (i) FIGS. 2A and 3A and (ii) FIGS. 2B and 3B, respectively). Further, the input signals applied to the inputs of the one-hot-bit multiplexer during normal operation may originate from data storage elements (e.g., memory cell, register, flip-flop, latch, block/array of memory), input pins, LUT, and/or outputs of other multiplexers. (See, for example, FIGS. 2A and 2B). As such, under typical/normal operating conditions (i.e., when the switch interconnect network of the integrated circuit is operational), input signals having predetermined (and often pre-programmed—and most likely different polarities) are defined by, for example, data stored in a memory cell, register, flip-flop, latch, block/array of memory, LUT, and/or data defined by an output of one or more other multiplexer, are applied to the multiplexer inputs. In one exemplary of a one-hot-bit multiplexer configuration, an active or selected input is electrically coupled to the output based on the state or polarity of the input select or control signals/data associated with the input and applied to the input selects of the multiplexer thereby electrically coupling such input signal to the output of the multiplexer. The other inputs of the one-hot-bit multiplexer are inactive or not selected (i.e., not electrically coupled to the output of the multiplexer) as a result of the data states of input select or control signals which are associated with and control such other inactive or not selected inputs and are different from the input select or control data/signals associated with the active or selected input.

With reference to FIGS. 4A, 5A and 5B, the one-hot-bit multiplexer polarity control circuitry generates input signals (having the same or a common polarity) and, when engaged or enabled during for example, start-up or initialization, applies such input signals to one or more (or all) one-hot-bit multiplexers of the switch interconnect network (see FIG. 5B). In the illustrated exemplary embodiment, when control or enable/disable signal "INIT" is high (INIT=1), the one-hot-bit multiplexer polarity control circuitry generates input signals having a common polarity, which are applied to the inputs of the one-hot-bit multiplexers during the process. Upon completion of the power-up, start-up, initialization, re-initialization or the like sequence, the one-hot-bit multiplexer polarity control circuitry may be disengaged and the process terminated. In the illustrated exemplary embodiment, when control or enable/disable signal INIT is low (INIT=0), the one-hot-bit multiplexer polarity control circuitry is disabled or disengaged and the data states of the input signals applied to the inputs of the one-hot-bit multiplexers are no longer controlled by the one-hot-bit multiplexer polarity control circuitry. In this way, a common or the same polarity or data state of the input signals is applied to the inputs of the one-hot-bit multiplexers of the switch interconnect network during or at power-up, start-up, initialization, re-initialization or the like sequence/operation and, thereafter or once the sequence/operation/process is complete, the inputs of the one-hot-bit multiplexers of the switch interconnect network receive input signals having characteristics corresponding to the normal or typical operation of the switch interconnect network of the integrated circuit.

With reference to FIGS. 4A, 6A, 6B and 6C, where the present inventions are implemented in an interconnect network having one or more (or all) of the stages of network interconnects is/are configured in a mesh interconnect or architecture, the one-hot-bit multiplexer polarity control circuitry again generates signals (having the same or a common polarity) and, when enabled or engaged during for example, start-up or initialization, applies such signals to one or more (or all) one-hot-bit multiplexers of the mesh stage of the switch interconnect network (see FIGS. 6A, 6B and 6C). Like that described above, the one-hot-bit multiplexer polarity control circuitry when enabled or engaged generates a stable output signal of at least one of the multiplexers of the mesh network. The stable output signal is then input into a plurality of other multiplexers of the mesh network which, in turn, also output stable signals. In this way, the stable signal propagates through the network so that all of the multiplexers of the mesh network input and output stable signals having a known polarity or state. Upon completion of the power-up, start-up, initialization, re-initialization or the like sequence, the one-hot-bit multiplexer polarity control circuitry may be disabled or disengaged and the process terminated; in this way, a common or the same polarity or data state of the input signals is applied to the inputs of the one-hot-bit multiplexers of the switch interconnect network during or at power-up, start-up, initialization, re-initialization or the like sequence/operation and, thereafter or once the sequence/operation is complete, the inputs of the one-hot-bit multiplexers of the switch interconnect network receive input signals having characteristics corresponding to the normal or typical operation of the switch interconnect network of the integrated circuit.

Figure 1A:
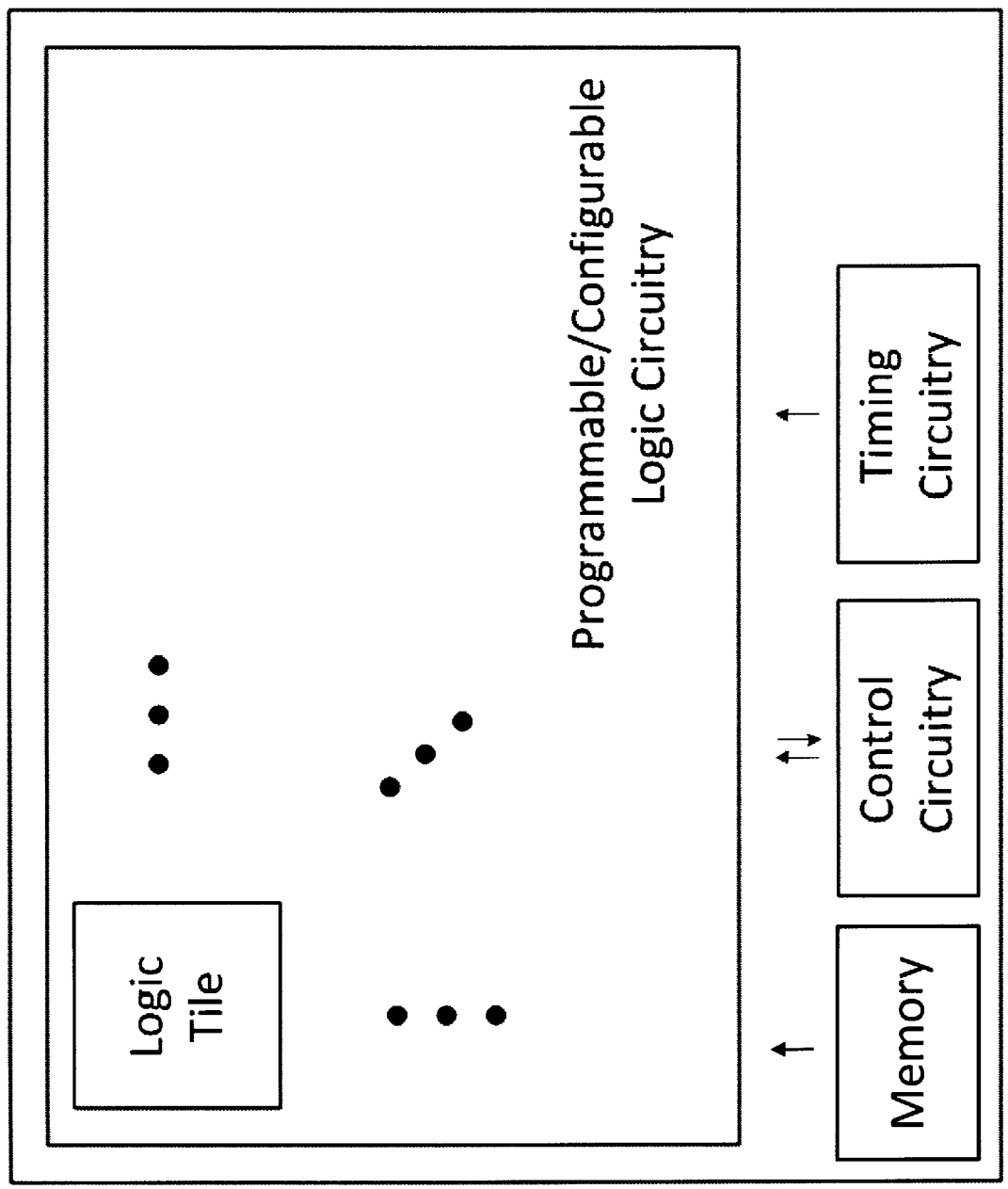
FIG. 1A illustrates a block diagram representation of, for example, an exemplary integrated circuit including control circuitry, clock circuitry and programmable/configurable logic circuitry (which may include one or more logic tiles, each of which includes logic transistors (that may be interconnected, for example, as multiplexers having two or more inputs which are electrically interconnected into a network as well as connected to, for example, associated data storage elements, input pins and/or lookup tables that, when programmed, determine the operation of the multiplexers))
Figure 1B:
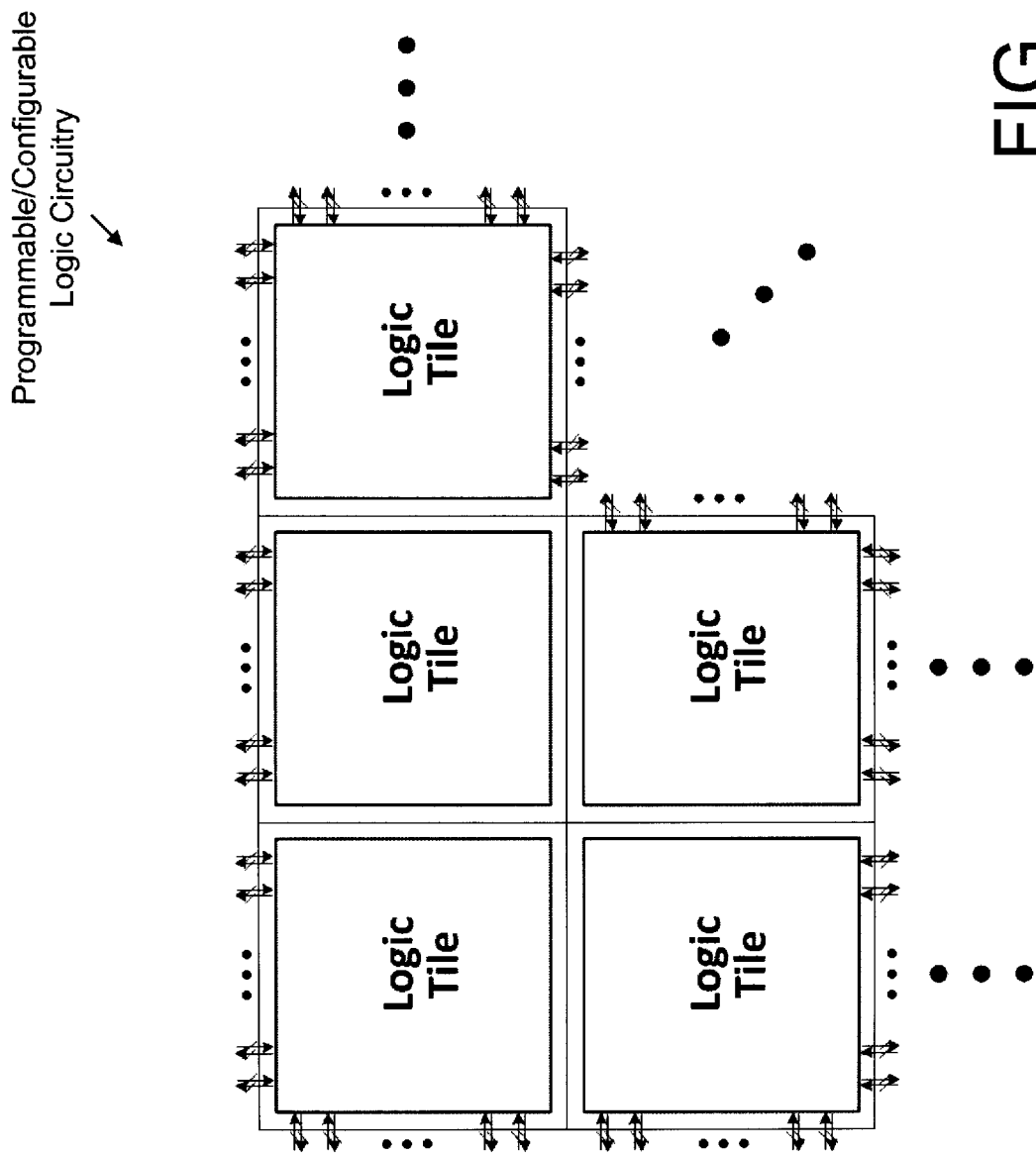
FIG. 1B illustrates a block diagram representation of a plurality of interconnected logic tiles of an exemplary embodiment of programmable/configurable logic circuitry, for example, of an exemplary FPGA, wherein input/output of the logic tiles may facilitate communication between logic tiles and/or circuitry external to the programmable/configurable logic circuitry; notably, the programmable/configurable logic circuitry may be comprised of a plurality of programmable logic tiles wherein each logic tile includes a plurality of multiplexers which are electrically interconnected into a network (for example, a hierarchical network and/or mesh network)—one, some or all of the multiplexers may be on-hot-bit design multiplexers.

In the illustrated exemplary embodiment of FIGS. 6B and 6C, when control or enable/disable signal "INIT" is high (INIT=1), a plurality of logic gates (in the illustrative embodiment NAND gates) of the one-hot-bit multiplexer polarity control circuitry generate signals having the same or a common polarity. Here, the NAND gates receive the enable/disable signal INIT as well as the output(s) of one or more multiplexers whose inputs are connected to multiplexers of other stages of the interconnect network as well as the outputs of the NAND gates of one-hot-bit multiplexer polarity control circuitry. That is, the output of the NAND gates are applied or routed to the input(s) of one or more multiplexers of Stage x.N of the same logic tile and/or one or more other logic tiles (if implemented in a multi-tile embodiment like that illustrated in FIGS. 1A and 1B). The configuration/circuit, in this embodiment, stabilizes the initial condition of the mesh network (Stage x.N, where x=an integer representing the number of stages of the network) of the associated tile (i.e., the tile in which the configuration/circuit resides) as well as facilitates stabilization of the mesh network of one or more associated logic tiles connected thereto (for example, neighboring logic tiles).

Notably, although the one-hot-bit multiplexer polarity control circuitry is illustrated as one multiplexer and one logic gate (in this illustrative exemplary embodiment, a NAND logic), such control circuitry includes a plurality of such multiplexer and logic or logic gates (and may include other circuitry as well). Indeed, as intimated above, one or more inputs of the multiplexer may be coupled to a plurality of multiplexers of one or more other stages of the interconnect network associated with the mesh network (i.e., Stage x.N).

Like that described above, upon completion of the power-up, start-up, initialization, re-initialization or the like sequence, the one-hot-bit multiplexer polarity control circuitry may be disabled or disengaged and the process terminated. For example, with reference to FIGS. 6B and 6C, when control or enable/disable signal INIT is low (INIT=0), the logic gates (in this specific implementation NAND gates) of the one-hot-bit multiplexer polarity control circuitry are disabled or disengaged and the output signals of such NAND gates are determined by the output signal of the multiplexer which corresponds to normal operation. In this way, the common or the same polarity or data state of the input signals is not applied to the inputs of the one-hot-bit multiplexers of the mesh network stage of the switch interconnect network after a power-up, start-up, initialization, re-initialization or the like sequence/operation is complete and, in normal operation, the inputs of the one-hot-bit multiplexers of the mesh network stage receive input signals (from the output of the multiplexer) which are based on normal or typical operation of the switch interconnect network of the integrated circuit.

Figure 4B:
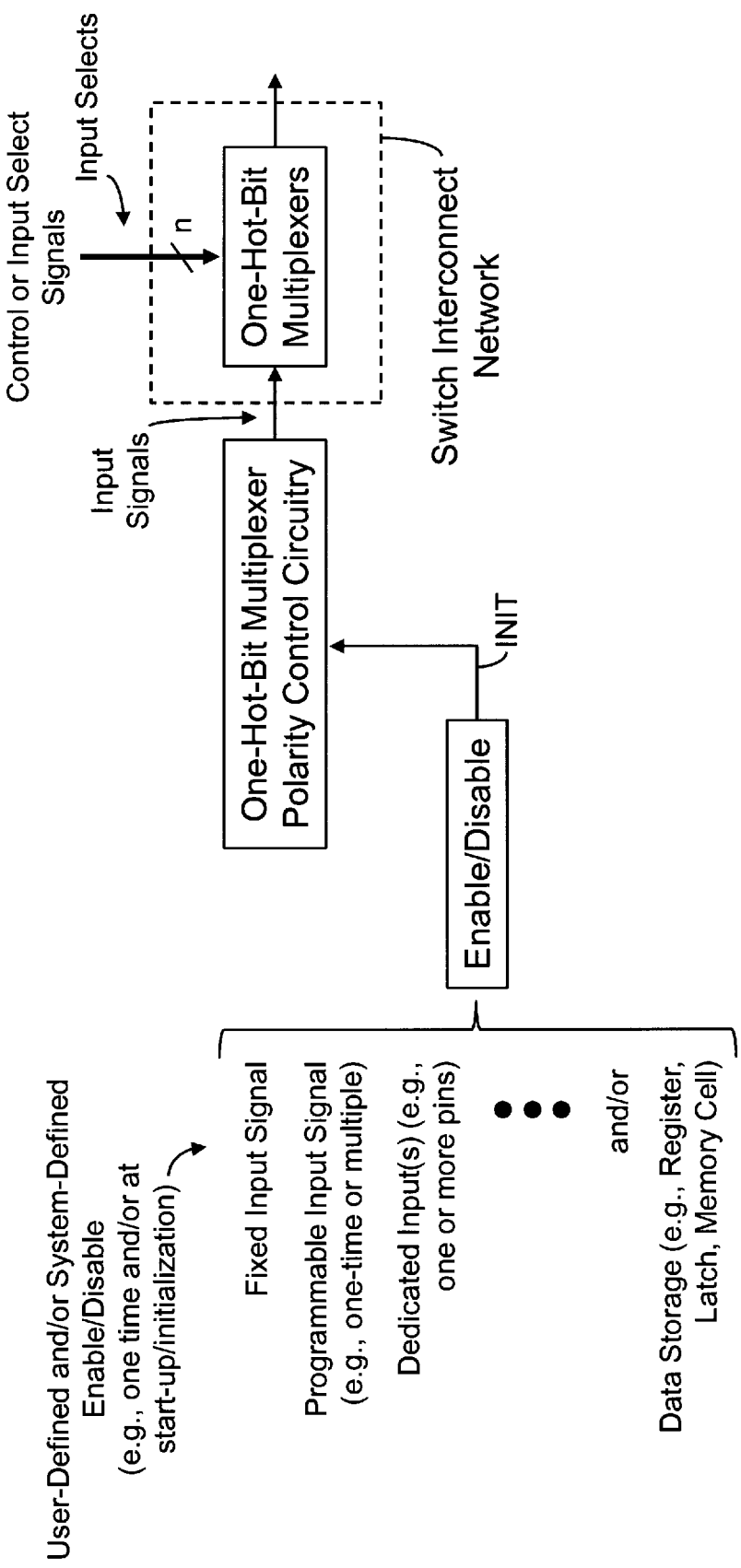

With reference to FIGS. 4B, 5A and 5B, in one embodiment, the one-hot-bit multiplexer polarity control circuitry and techniques of an integrated circuit may be selectively enabled or disabled, for example, prior to, at or during initialization, re-initialization or start-up, and/or in situ. Here, a circuit, system, user and/or operator may enable or disable the process of applying input signals to a common or the same polarity one-hot-bit multiplexers of the switch interconnect network at or during power-up, start-up, initialization, re-initialization or the like (e.g., before normal operation). For example, in one embodiment, the one-hot-input multiplexer polarity control circuitry may be selectively disabled wherein, in response, the one-hot-input multiplexer polarity control circuitry may not generate input signals having a common polarity and/or may not applying input signals to the one or more one-hot-bit multiplexers of the switch interconnect network at or during power-up, start-up, initialization, re-initialization or the like (e.g., before normal or typical operation).

Similarly, with reference to FIGS. 4B, 6A, 6B and 6C, in one embodiment where the stages of the interconnect network includes one or more (or all) mesh networks, the one-hot-bit multiplexer polarity control circuitry and techniques of an integrated circuit that control the mesh network stages may be selectively enabled or disabled, for example, prior to, at or during initialization, re-initialization or start-up, and/or in situ. Here, a circuit, system, user and/or operator may enable or disable the process of applying input signals to a common or the same polarity one-hot-bit multiplexers of the switch interconnect network at or during power-up, start-up, initialization, re-initialization or the like (e.g., before normal operation). For example, in one embodiment, the one-hot-input multiplexer polarity control circuitry associated with the mesh network stage(s) may be selectively disabled wherein, in response, the one-hot-input multiplexer polarity control circuitry may not generate input signals having a common polarity and/or may not applying input signals to the one or more one-hot-bit multiplexers of the mesh network stage(s) of the switch interconnect network at or during power-up, start-up, initialization, re-initialization or the like (e.g., before normal or typical operation).

In one embodiment, a system, user and/or operator may program or store a data, value or command in a resident or an on-chip mode/operations register to enable or disable the one-hot-bit multiplexer polarity control circuitry and/or techniques. For example, such data, value or command may control whether power is applied to the one-hot-input multiplexer polarity control circuitry. When power is applied to the control circuitry, the control circuitry engages and disengages as described herein; in contrast, when power is not applied to the one-hot-input multiplexer polarity control circuitry, the control circuitry and techniques described herein are not employed in relation to the one-hot-bit multiplexers of the switch interconnect network at or during power-up, start-up, initialization, re-initialization or the like.

Notably, any circuitry or technique now known or later developed (all of which are intended to fall within the scope of the present inventions) may be employed to enable or disable before or during, for example, initialization, re-initialization or at start-up, the one-hot-bit multiplexer polarity control circuitry and techniques of an integrated circuit (for example, an FPGA). All such circuitry and techniques are intended to fall within the scope of the present inventions.

In one embodiment, a system, circuitry (which may be located on-chip or off-chip), user and/or operator may analyze the switch fabric or interconnect network to identify one or more (or all) of the one-hot-bit multiplexers and thereafter manage or control the inputs of the one-hot-bit multiplexers at or during power-up, start-up, initialization, re-initialization or the like as described and illustrated herein. Such system, circuitry, user and/or operator may identify which input signals of the one-hot-bit multiplexers differ in polarity depending on the in situ or polarity or state of an input signal during normal operation (which may originate in or be stored in, for example, a LUT). Based thereon, the one-hot-bit multiplexer polarity control circuitry may include or incorporate inverters (for example, at power-up) in one or more input signal paths where necessary to change the polarity of the input signals so that the one-hot-bit multiplexers of the switch interconnect network receive input signals having a common or the same polarity at or during such power-up, start-up, initialization, re-initialization or the like (e.g., before the integrated circuit is fully operational).

In addition thereto, or in lieu thereof, the system, circuitry, user and/or operator may analyze the switch fabric or interconnect network to identify signals that are fixed and "conflict" (i.e., have or include a polarity of an input signal that is different from the polarity of one or more other input signals), and/or signals having an unknown polarity (for example, at power-up or start-up), and/or signals that are timing critical or in a critical path (wherein the timing of signals provided via the critical path are important for proper and orderly operation of the IC). Again, based thereon, the one-hot-bit multiplexer polarity control circuitry may be configured with digital logic (for example, AND, NAND, OR, NOR and/or inverter logic) generate signals having a polarity which is common or the same polarity as the other input signals so that the one-hot-bit multiplexers of the switch interconnect network receive inputs having a common or the same polarity from the one-hot-bit multiplexer polarity control circuitry at or during such power-up, start-up, initialization, re-initialization or the like (e.g., before the integrated circuit is fully operational).

In one embodiment, the one-hot-input multiplexer polarity control circuitry and/or processes may be configured, designed and/or implemented using one, some or all of the aforementioned information or criteria/factors in order to determine a desirable or advantageous common polarity of the input signals to generate and apply to the one-hot-bit multiplexers of the switch interconnect network to, at or during power-up, start-up, initialization, re-initialization or the like. All permutations and combinations of such information or criteria/factors are intended to fall within the scope of the present inventions. For example, where the input signals are fixed and not in the critical path (but have a polarity or data state that is different from other input signals of the multiplexer), in one embodiment, the one-hot-bit polarity control circuitry may be configured to incorporate logic to change the polarity of such signals to be consistent with other signals applied to the inputs of the one-hot-bit multiplexer. Where, however, the signals are in the critical path, the one-hot-bit polarity control circuitry may be configured to avoid any adverse impact on such signal—for example, by introducing one or more inverters or buffers into the critical path. In this situation, the one-hot-bit polarity control circuitry may be configured to modify the polarity of other input signals (for example, not timing critical or non-critical path signals) in order to establish or provide the appropriate polarity or data state of the input signals of the one-hot-bit multiplexers of the switch interconnect network. In another example, in cases where a critical path signals shares the same polarity with many non-critical paths of the same signal, a non-inverting buffer maybe implemented/used to drive the non-critical path signals to reduce the signal loading seen on the critical path. Thus, in one embodiment, the one-hot-bit polarity control circuitry may be configured to change the polarity of non-critical signals (i.e., not timing critical signals) provided to the one-hot-bit multiplexers.

With knowledge of the switch fabric/network and critical paths of signals in the switch fabric/network, the one-hot-bit polarity control circuitry may be configured, designed and/or implemented by incorporating one or more inverters into the path of the input signals so that the polarity of the signals applied to one-hot-bit multiplexers (whether such signals original from data storage or another multiplexer) are common at or during power-up, start-up, initialization, re-initialization or the like (for example, before normal operation of the integrated circuit). Notably, the signal paths of the input signals of the one-hot-bit multiplexer polarity control circuitry which determine the polarity of the input signals may be defined or programmed, for example, prior to manufacture, at manufacture, after manufacture, during initialization or start-up, and/or in situ. Indeed, the one-hot-bit multiplexer polarity control circuitry may include or employ any logic now known or later developed and any form of logic (for example, a multiplexer and/or AND, NAND, OR, NOR and/or inverter logic, which may have n-input and m-output gates, where n and m may be the same or different and are greater than or equal to one—see for example, FIGS. 5A and 5B).

Thus, in one embodiment, the circuitry according to the present inventions may further determine and program a data state or polarity for the inputs of the one or more (or all) one-hot-bit multiplexers which accommodates predetermined considerations of the integrated circuit or operation thereof (for example, power consumption, amount of circuitry employed (e.g., number of inverters incorporated into the signal paths) and/or signals having critical timing).

In another aspect of the present inventions, circuitry and methods of the present inventions flush or purge the data state of the data stored in configuration memory cells (which are connected to the connected to the input selects of the multiplexers (for example, the one-hot-bit multiplexers) of the switch interconnect network), for example, at or during power-up, start-up, initialization, re-initialization, configuration, re-configuration or the like prior to writing, programming or storing new configuration or re-configuration data into the configuration memory cells. In one embodiment, the circuitry and method stores or programs control or input select data in the configuration memory cells data having a common or the same polarity so that the state of each memory cell is (i) known at or during such power-up, start-up, initialization, re-initialization, configuration, re-configuration or the like and (ii) before programming or storing control or input select data into the configuration memory cells with data corresponding to the configuration data of the desired interconnect architecture of the switch network (whether such data corresponds to an initial configuration or re-configuration sequence).

After the data stored in the configuration memory cells is flushed or purged, the circuitry and method loads, writes, programs or stores control or input select data into the memory cells associated with, for example, one or more (or all) multiplexers of a switch interconnect network (for example, a hierarchical network and/or mesh network) which, in response, configures the switches or multiplexers to provide the desired switch interconnect network. Thus, in one aspect of the present inventions, a flush or purge sequence or operation is performed before the new configuration data is written into the memory cells and is enabled or implemented before or during a configuration or re-configuration sequence of the switch interconnect network. In one embodiment, the flush or purge sequence or operation stores a common or the same polarity or data state into each memory cell that store configuration data that control the switches or multiplexers of the switch interconnect network. Thereafter, the control or input select data is stored in the configuration memory cells, which when applied to the multiplexers of the switch network provides the appropriate interconnect architecture.

With reference to FIG. 7A, in one embodiment, master-slave latch network provide access points to the configuration memory cells which are connected to the multiplexers (see, for example, FIGS. 3A and 3B). In operation, the master-slave latches are placed in a transparent mode via simultaneous or concurrent application of the master and slave clock signals to the latches wherein known data (having a common polarity or the same data state) are applied to or available at the input of the configuration memory cells. Thereafter, a write command is applied to the memory cells to write/store the data into the configuration memory cells thereby flushing or purging the previously held data. In one embodiment, before or after completion of the flush or purge sequence/operation (where before complete—for only those configuration memory cells that have already been flushed or purged), the configuration memory cells are programmed with data to configure or re-configure the switches or multiplexers of the switch network to establish a desired interconnect architecture of the switch network at or during power-up, start-up, initialization, re-initialization, configuration and re-configuration or the like (e.g., before normal operation). The data stored in the memory cells are applied to the input selects of the multiplexers to control which input of the multiplexer is coupled to the output of the multiplexer (see, for example, FIGS. 3A and 3B). As such, after the data stored in the configuration memory cells is flushed or purged by writing over that data (for example, with a common data state), circuitry programs configuration memory cells (that had already been flushed or purged) with the appropriate configuration data to facilitate configuration or re-configuration of the multiplexers of the switch network to establish a desired interconnect configuration of the network.

With reference to FIG. 7B, in another embodiment, the data signal AND'ed with the FLUSH or INIT signal, generating a constant logic low or 0, is applied to or available at the input of the configuration memory cells to store logic low or 0 data state into each memory cell. In yet another embodiment, the data signal OR'ed with the FLUSH or INIT signal, generating a constant logic high or 1, is applied to or available at the input of the configuration memory cells to store a logic high or 1 data state into each memory cell. In either embodiment, a write command may then be applied to the memory cells to write/store the data into the configuration memory cells thereby flushing or purging the previously held data. As noted above, after the data stored in the configuration memory cells is flushed or purged by writing over that data (for example, with a common data state), circuitry programs configuration memory cells (that had already been flushed or purged) with the appropriate configuration data to facilitate configuration or re-configuration of the multiplexers of the switch network to establish a desired interconnect configuration of the network.

Notably, in one embodiment, the one-hot-input multiplexer polarity control processes and the configuration/re-configuration data flush or purge processes may be performed concurrently or sequentially at or during power-up, start-up, initialization, re-initialization, configuration and re-configuration or the like (e.g., before normal operation). Indeed, with reference to FIG. 8, in one embodiment, implementation and control of these processes may be integrated via a power on reset (POR) signal that is enabled at or during power-up, start-up, initialization, re-initialization, configuration and re-configuration or the like. As such, control circuitry may thereafter enable or implement either or both of the processes via application of an associated enable signal. Where both processes are implemented, the associated enabled signal may be concurrently or sequentially applied.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, the present inventions may be employed in connection with one-hot-bit multiplexers of any switch interconnect network now known or later developed including a mesh-type network and/or a hierarchical network.

Further, although the memory cells in certain embodiments are illustrated as a static memory cells, the present inventions may employ dynamic or static memory cells. Indeed, as stated above, such static cells may be latches, flip/flops or any other static memory cell or memory cell circuit now known or later developed. Indeed, one or more (or all) of the inputs and/or input selects associated with a one-hot-bit multiplexer may be electrically connected to, for example, data storage elements (e.g., memory cell, register, flip-flop, latch, block/array of memory), input pins and/or lookup tables—which may be "programmed" after manufacture, during initialization or start-up, situ and/or post-configuration of the integrated circuit (for example, via control circuitry of the integrated circuit or external circuitry).

Notably, any type or configuration of one-hot-bit multiplexers, whether now known or later developed, may be employed to implement the inventions described and/or illustrated herein. Such multiplexers may be implemented as switches. For example, an interconnect routing or switch network/architecture of switches or multiplexers allows for high-speed communications within an integrated circuit, for example, an FPGA. Here, an FPGA contains various computing elements that communicate in performing operations via the routing or switch network/architecture. The switches/multiplexers of the routing or switch network often comprise a majority of the area on a FPGA. Indeed, the switches and multiplexers that are or are capable of being employed in the routing or switch network/architecture of an integrated circuit may also be employed to implement the inventions described and/or illustrated herein.

Notably, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

The techniques described herein may be implemented using control circuitry (for example, one or more processors (suitably programmed)) to perform, execute and/or assess one or more of the functions or operations described herein to program the data storage elements and thereby configure the multiplexers according to the present inventions. Here, the control circuitry (which may be disposed on the integrated circuit) is employed to identify one-hot-bit multiplexers during initialization or at start-up, and/or in situ. In one embodiment, the control circuitry evaluates the characteristics and configuration of the switch fabric and determines appropriate input signals for one or more one-hot-bit multiplexers. In response, the control circuitry may generate input signals for such multiplexers and apply such input signals at or during power-up, start-up, initialization, re-initialization or the like (for example, before normal operation of the integrated circuit) in order to accommodate predetermined considerations of the integrated circuit or operation thereof (for example, power consumption, amount of circuitry employed (e.g., number of inverters incorporated into the signal paths) and/or signals having critical timing).

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

Notably, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus. Further, use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "logic tile" means a design unit or block of a plurality of transistors (typically more than thousands), which, in this application, is capable of connecting to a plurality of neighboring "tiles", "cores" or "blocks". The term "multiplexers" means multiplexers and/or switches. Moreover, as noted above, the term (i) "integrated circuit" means, among other things, a processor, controller, state machine, gate array, SOC, PGA and/or FPGA. The term "initialization operation" means the power-up, start-up, initialization, re-initialization, configuration, and/or re-configuration operation of the switch interconnect network and/or the integrated circuit. The term "initialization signal" means a signal that is generated in response to and/or based on the power-up, start-up, initialization, re-initialization, configuration, and/or re-configuration operation.

What is claimed is:

1. An integrated circuit comprising:
   a plurality of one-hot-bit multiplexers interconnected to form a switch interconnect network, wherein each of the plurality of one-hot-bit multiplexers includes an output, a plurality of inputs, and a plurality of input selects, wherein:
   each input select is associated with a unique input and is coupled to a unique memory cell which stores an input select data associated with selection of the unique input, and
   each one-hot-bit multiplexer of the plurality of one-hot-bit multiplexers is configurable to receive: (i) an input select signal to select one of the plurality of inputs, (ii) an operational input signal at a selected input during a normal operation of the switch interconnect network, and (iii) an initialization input signal at each of the plurality of inputs during an initialization operation; and
   initialization circuitry, coupled to one or more of the inputs of each of the one-hot-bit multiplexers, to generate a plurality of initialization input signals in response to an initialization signal, wherein:
   the initialization input signals have: (i) an identical data state and (ii) are applied to the plurality of inputs of each of the plurality of one-hot-bit multiplexers only during the initialization operation.

2. The integrated circuit of claim 1 wherein the integrated circuit is a field programmable gate array.

3. The integrated circuit of claim 1 wherein the initialization circuitry comprises a plurality of NOR gates.

4. The integrated circuit of claim 1 wherein the initialization circuitry is enabled in response to an initialization signal.

5. The integrated circuit of claim 1 wherein the identical data state is a logic high data state.

6. The integrated circuit of claim 1 wherein the plurality of one-hot-bit multiplexers are interconnected to form a mesh network.

7. The integrated circuit of claim 1 wherein the initialization circuitry is: (i) enabled during the initialization operation and (ii) disabled during the normal operation of the switch interconnect network.

8. A method to control a plurality of one-hot-bit multiplexers of an integrated circuit, wherein the one-hot-bit multiplexers are interconnected to form a switch interconnect network, and wherein each of the plurality of one-hot-bit multiplexers includes an output, a plurality of inputs, and a plurality of input selects, wherein each input select is associated with a unique input, the method comprising:
    applying data to one or more of the plurality of inputs of each one-hot-bit multiplexer of the plurality of one-hot-bit multiplexer;
    applying an input select signal to each one-hot-bit multiplexer of the plurality of one-hot-bit multiplexer to select one of the plurality of inputs thereof wherein, in response, each one-hot-bit multiplexer connects the selected input to the output thereof;
    applying an operational input signal to the selected input of each one-hot-bit multiplexer of the plurality of one-hot-bit multiplexer during normal operation of the switch interconnect network wherein the operational input signal corresponds to the data applied to the input during normal operation of the switch interconnect network;
    generating a plurality of initialization input signals in response to an initialization signal and during an initialization operation, wherein each of the plurality of initialization input signals has an identical polarity; and
    applying one of the initialization input signals to each of the inputs of the plurality of inputs of each one-hot-bit multiplexer of the plurality of one-hot-bit multiplexer only during an initialization operation wherein, during the initialization operation, the inputs of the plurality of inputs of each one-hot-bit multiplexer of the plurality of one-hot-bit multiplexer receive one of the initialization input signals having an identical polarity.

9. The method of claim 8 wherein the polarity of the initialization input signals is logic high.

10. The method of claim 8 further including:
    generating an initialization signal wherein, in response thereto, the switch interconnect network is placed in an initialization mode.

11. The method of claim 8 wherein the integrated circuit is a field programmable gate array.

12. The method of claim 8 further including:
    generating an initialization signal,
    logically and separately combining the initialization signal and the operational input signal for each one-hot-bit multiplexer of the plurality of one-hot-bit multiplexer during the initialization operation, to generate the initialization input signals, wherein each of the plurality of initialization input signals has the same polarity.

13. An integrated circuit comprising:
    a plurality of one-hot-bit multiplexers interconnected to form a hierarchical and mesh switch interconnect network, wherein each of the plurality of one-hot-bit multiplexers includes an output, a plurality of inputs, and a plurality of input selects, wherein:
        each one-hot-bit multiplexer of the plurality of one-hot-bit multiplexers is configurable to receive: (i) an input select signal to select one of the plurality of inputs, (ii) an operational input signal at a selected input during a normal operation of the switch interconnect network, and (iii) an initialization input signal at each of the inputs of the plurality of inputs during an initialization operation; and
    initialization circuitry, coupled to one or more of the inputs of each of the one-hot-bit multiplexers, to generate a plurality of initialization input signals, in response to an initialization signal, during an initialization operation, wherein:
        the initialization input signals: (i) have an identical data state and (ii) are applied to the plurality of inputs of each of the plurality of one-hot-bit multiplexers only during the initialization operation.

14. The integrated circuit of claim 13 wherein the integrated circuit is a field programmable gate array.

15. The integrated circuit of claim 13 wherein the initialization circuitry comprises a plurality of NOR gates.

16. The integrated circuit of claim 15 wherein the initialization circuitry further comprises a plurality of NAND gates.

17. The integrated circuit of claim 13 wherein the initialization circuitry is enabled in response to an initialization signal and during an initialization mode of the switch interconnect network.

18. The integrated circuit of claim 13 wherein the data state of the initialization input signals is a logic high data state.

19. The integrated circuit of claim 13 wherein the initialization circuitry is: (i) enabled during the initialization operation and (ii) disabled during the normal operation of the switch interconnect network.

20. The integrated circuit of claim 13 wherein:
    the initialization circuitry (i) comprises a plurality of NOR gates and (ii)(a) is enabled during the initialization operation and (ii)(b) is disabled during the normal operation of the switch interconnect network.

* * * * *